(12) United States Patent
Cheng et al.

(10) Patent No.: US 11,791,358 B2
(45) Date of Patent: Oct. 17, 2023

(54) METHOD OF FORMING SEMICONDUCTOR DEVICE

(71) Applicant: TAIWAN SEMICONDUCTOR MANUFACTURING CO., LTD., Hsinchu (TW)

(72) Inventors: Yun-Wei Cheng, Taipei (TW); Chun-Hao Chou, Tainan (TW); Kuo-Cheng Lee, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 124 days.

(21) Appl. No.: 17/396,693

(22) Filed: Aug. 7, 2021

(65) Prior Publication Data
US 2021/0366957 A1    Nov. 25, 2021

Related U.S. Application Data

(62) Division of application No. 15/879,824, filed on Jan. 25, 2018, now Pat. No. 11,088,189.

(60) Provisional application No. 62/585,929, filed on Nov. 14, 2017.

(51) Int. Cl.
*H01L 27/146*     (2006.01)
*H01L 31/036*     (2006.01)

(52) U.S. Cl.
CPC ...... *H01L 27/1463* (2013.01); *H01L 27/1464* (2013.01); *H01L 27/14607* (2013.01); *H01L 27/14629* (2013.01); *H01L 27/14683* (2013.01); *H01L 31/036* (2013.01)

(58) Field of Classification Search
CPC .......... H01L 27/1463; H01L 27/14607; H01L 27/14683; H01L 31/036
See application file for complete search history.

(56) References Cited

U.S. PATENT DOCUMENTS

| | | |
|---|---|---|
| 3,031,403 A | 4/1962 | Bennett, Jr. |
| 6,713,827 B2 | 3/2004 | Cohen et al. |
| 8,350,273 B2 | 1/2013 | Vielemeyer |
| 9,917,121 B2 | 3/2018 | Hsu et al. |
| 10,050,078 B2 | 8/2018 | Jin et al. |
| 2006/0169987 A1 | 8/2006 | Miura et al. |

(Continued)

OTHER PUBLICATIONS

Sze et al., Physics of Semiconductor Devices, Third Edition, 2007 John Wiley & Sons, Inc., pp. 7-12 (Year: 2007).*

*Primary Examiner* — Shih Tsun A Chou
(74) *Attorney, Agent, or Firm* — Maschoff Brennan

(57) ABSTRACT

A method of forming a semiconductor device includes forming photodiodes extending from a front-side surface of a semiconductor layer into the semiconductor layer; forming transistors on the front-side surface of the semiconductor layer; forming an interconnect structure over the transistors, the interconnect structure comprising an inter-metal dielectric and metal lines in the inter-metal dielectric; etching first regions of a backside surface of the semiconductor layer to form trenches in the semiconductor layer and non-overlapping the photodiodes; after forming the trenches, etching second regions of the backside surface of the semiconductor layer to form pits in the semiconductor layer and overlapping the photodiodes; and depositing a dielectric material in the trenches and the pits.

20 Claims, 19 Drawing Sheets

(56) References Cited

U.S. PATENT DOCUMENTS

| | | |
|---|---|---|
| 2007/0205407 A1 | 9/2007 | Matsuo et al. |
| 2009/0004840 A1* | 1/2009 | Farinelli .............. H05K 3/3457 |
| | | 216/18 |
| 2009/0039361 A1 | 2/2009 | Li et al. |
| 2013/0193560 A1 | 8/2013 | Usui |
| 2015/0061062 A1* | 3/2015 | Lin ................... H01L 27/14689 |
| | | 438/69 |
| 2015/0243696 A1* | 8/2015 | Chien ............... H01L 27/14685 |
| | | 257/435 |
| 2016/0020235 A1* | 1/2016 | Yamashita ........ H01L 27/14634 |
| | | 250/206 |
| 2016/0054172 A1 | 2/2016 | Roh et al. |
| 2016/0197207 A1* | 7/2016 | Morioka ............ H01L 31/1804 |
| | | 438/98 |
| 2016/0307946 A1 | 10/2016 | Huang et al. |
| 2016/0351734 A1 | 12/2016 | Gershon et al. |
| 2017/0110493 A1 | 4/2017 | Yokogawa |
| 2018/0182806 A1 | 6/2018 | Jin et al. |
| 2018/0197903 A1 | 7/2018 | Hsu et al. |
| 2019/0027518 A1* | 1/2019 | Miyata .............. H01L 27/14621 |

\* cited by examiner

METHOD OF FORMING SEMICONDUCTOR DEVICE

RELATED APPLICATIONS

This present application is a divisional application of U.S. patent application Ser. No. 15/879,824, filed on Jan. 25, 2018, now U.S. Pat. No. 11,088,189, issued on Aug. 10, 2021, which claims priority to U.S. Provisional Application Ser. No. 62/585,929, filed Nov. 14, 2017, all of which are herein incorporated by reference in their entirety.

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the absorbed light into digital data or electrical signals.

Back side illuminated (BSI) CMOS image sensors are one type of CMOS image sensors. The BSI CMOS image sensors are operable to detect light projected from their backside. The BSI CMOS image sensors can shorten optical paths and increase fill factors to improve light sensitivity per unit area and quantum efficiency, and can reduce cross talk and photo response non-uniformity. Hence, the image quality of the CMOS image sensors can be significantly improved. Furthermore, the BSI CMOS image sensors have high chief ray angles, which allow shorter lens heights to be implemented, so that thinner camera modules are achieved. Accordingly, the BSI CMOS image sensor technology is becoming a mainstream technology.

However, conventional BSI CMOS image sensors have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
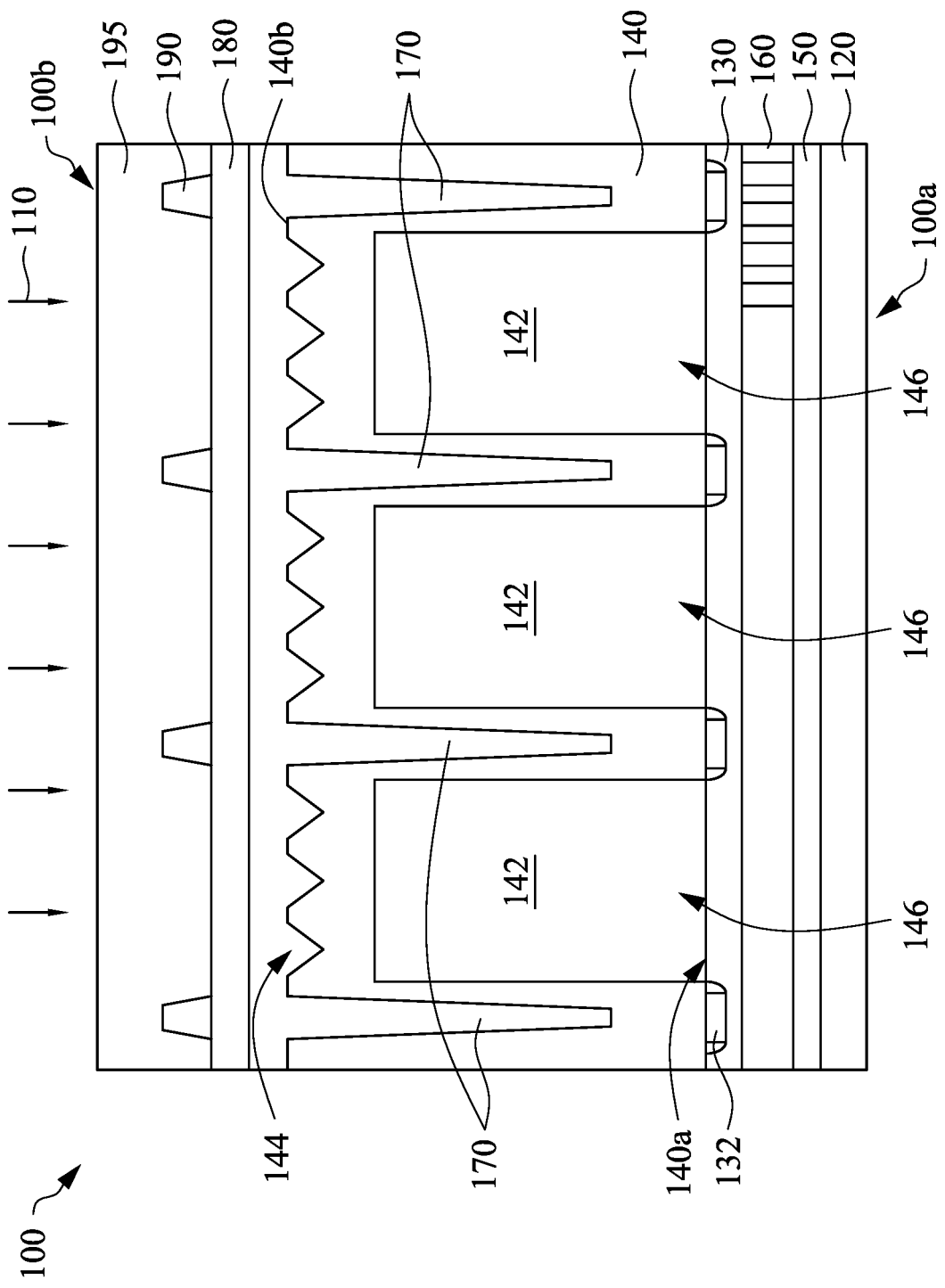
FIG. 1 is a schematic cross-sectional view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

A high absorption structure in a CMOS image sensor is a surface topography for increasing optical scattering and refraction, so as to enhance the optical injection efficiency, thereby increasing the absorption efficiency of the semiconductor layer. In different CMOS image sensor technology generation, raw materials with different orientations may be used, and thus the design and the end result of the CMOS image sensor may be changed correspondingly.

Embodiments of the present disclosure are directed to providing a semiconductor device and a method for manufacturing the semiconductor device, in which a semiconductor layer on a device layer has a surface having a lattice plane which is tilted with respect to a basal plane. The basal plane is the plane perpendicular to the principal axis in a crystal system, such as one of a {100} family of planes of a cubic system. For example, the lattice plane may be one of a {110} family of planes of a cubic system or one of a {111} family of planes of the cubic system. Thus, when the semiconductor layer having the surface with the lattice plane, which is one of the {110} family of planes of the cubic system or one of the {111} family of planes of the cubic system, is used, an etching process performed on the surface of the semiconductor layer forms various pyramid pit portions or prism pit portions on the surface of the semiconductor layer, such that most of light may be scattered and refracted by the pit portions on the surface of the semiconductor layer, and then may enter the semiconductor layer and be absorbed by the semiconductor layer. Accordingly, quantum efficiency of the semiconductor device is significantly enhanced due to low reflection and high absorption.

FIG. 1 is schematic cross-sectional view of a semiconductor device in accordance with various embodiments. In some embodiments, a semiconductor device 100 is a CMOS image sensor device, which may be operated for sensing incident light 110. The semiconductor device 100 has a front side 100a and a back side 100b. In some embodiments, the semiconductor device 100 is a BSI CMOS image sensor device, which is operated to sense the incident light 110 projected from its back side 100b.

In some examples, as shown in FIG. 1, the semiconductor device 100 includes a carrier 120, a device layer 130, and a semiconductor layer 140. When the semiconductor device 100 is a general image sensor, in which light-sensing pixels and logic device are formed in the same wafer, the carrier 120 is a support base of the wafer for a flip chip process and/or a thinning process. When the semiconductor device 100 is a stacking image sensor, in which light-sensing pixels and logic devices are respectively formed on different wafers, the carrier 120 is a logic wafer on which the logic devices are formed.

The device layer 130 is disposed on the carrier 120. The device layer 130 includes various devices 132, such as transistors. In some exemplary examples, the semiconductor device 100 optionally includes a passivation layer 150. The passivation layer 150 is disposed on the carrier 120. The passivation layer 150 may be suitable for bonding the device layer 130 to the carrier 120. The passivation layer 150 may be a dielectric film, such as silicon oxide, silicon nitride, silicon oxynitride, silicon carbide, or any combinations thereof. Optionally, the semiconductor device 100 may include at least one inter-metal dielectric layer 160. The inter-metal dielectric layer 160 is disposed between the passivation layer 150 and the device layer 130. The inter-metal dielectric layer 160 includes conductive lines, which are electrically connected to the devices 132 of the device layer 130. The inter-metal dielectric layer 160 includes a dielectric film, such as silicon oxide, silicon nitride, silicon oxynitride, silicon carbide, or any combinations thereof.

Referring to FIG. 1 again, the semiconductor layer 140 is disposed on the device layer 130. The semiconductor layer 140 includes various light-sensing regions 142. Each of the light-sensing regions 142 may include a photodiode. The semiconductor layer 140 has a first surface 140a and a second surface 140b opposite to the first surface 140a, and the first surface 140a is adjacent to the device layer 130. The second surface 140b of the semiconductor layer 140 has a lattice plane which is tilted with respect to the basal plane. In some embodiments, the lattice plane of the second surface 140b of the semiconductor layer 140 is one of a {110} family of planes of a cubic system or one of a {111} family of planes of the cubic system. The semiconductor layer 140 may include a group IV material, a group IV material compound, or a group III-V material compound. For example, the group IV material and the group IV material compound may include Si, Ge, or SiGe. The group III-V material compound may include GaN, GaAs, InAs, InGaN, or InGaAs.

In some examples, as shown in FIG. 1, the semiconductor device 100 may optionally include various isolation structures 170. The isolation structures 170 are disposed in the semiconductor layer 140 to define various pixel regions 146. Each of the pixel regions 146 may include one of the light-sensing regions 142. In some exemplary examples, each of the isolation structures 170 is a deep trench isolation (DTI) structure extending from the second surface 140b of the semiconductor layer 140 to a predetermined depth of the semiconductor layer 140, so as to isolate two adjacent ones of the light-sensing regions 142. For example, each of the pixel regions 146 may be a rectangular region surrounded by the isolation structures 170. In certain examples, portions the isolation structures 170 extend to cover the second surface 140b of the semiconductor layer 140. The isolation structures 170 include a dielectric material, such as silicon oxide, silicon nitride, silicon oxynitride, silicon carbide, or any combinations thereof.

The semiconductor layer 140 has various pit portions 144 arranged on the second surface 140b. For example, the pit portions 144 may be pyramid pit portions or prism pit portions. In some examples, in each of the pixel regions 146, the pit portions 144 are regularly arranged on the second surface 140b. Any two adjacent ones of the pit portions 144 may adjoin to each other. In some examples, any two adjacent ones of the pit portions 144 are separated from each other. In addition, shapes of the pit portions 144 of the semiconductor layer 140 are substantially the same. For different semiconductor layers, pit portions on these semiconductor layers may have different shapes.

Figure 2A:
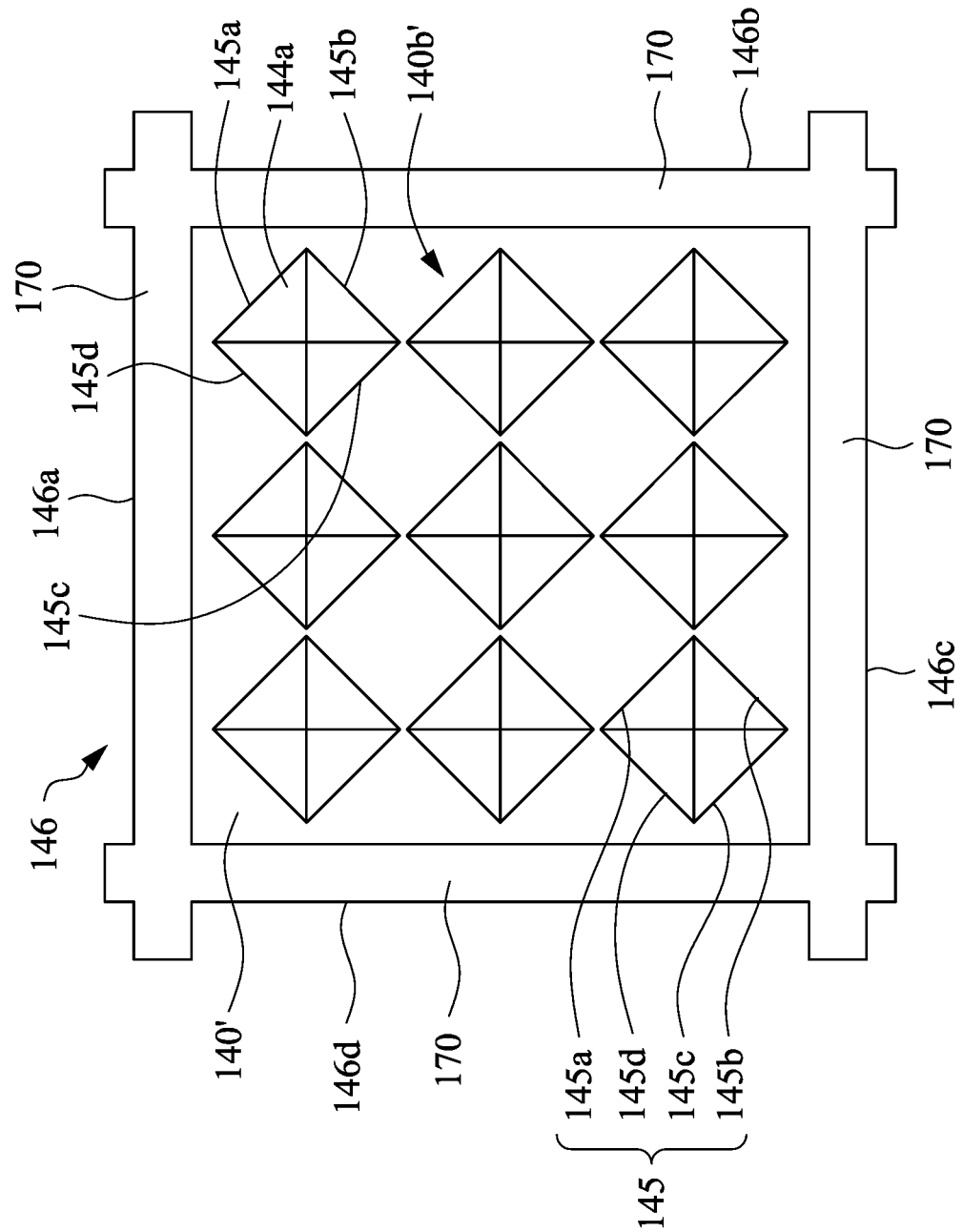
FIG. 2A is an enlarged schematic top view of a semiconductor layer and isolation structures in a pixel region of a semiconductor device in accordance with various embodiments.
Figure 2B:
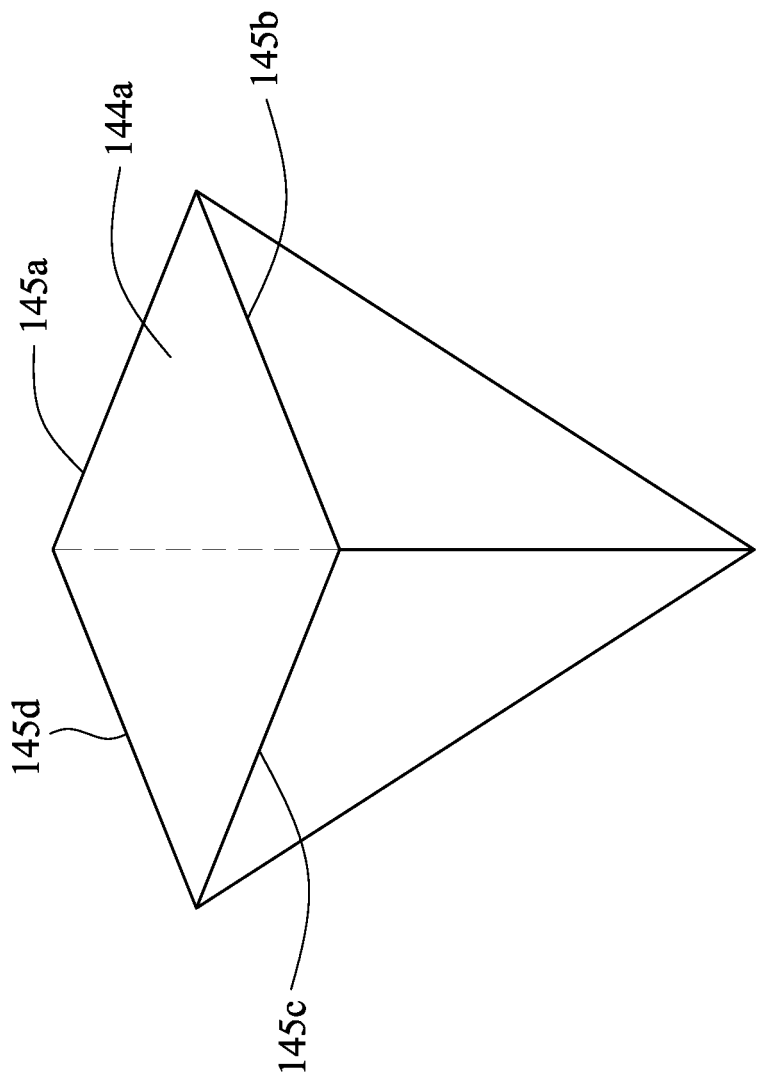
FIG. 2B is an enlarged schematic three-dimensional view of a pyramid pit portion of a semiconductor layer of a semiconductor device in accordance with various embodiments.

Referring to FIG. 2A and FIG. 2B, FIG. 2A is an enlarged schematic top view of a semiconductor layer and isolation structures in a pixel region of a semiconductor device in accordance with various embodiments, and FIG. 2B is an enlarged schematic three-dimensional view of a pyramid pit portion of a semiconductor layer of a semiconductor device in accordance with various embodiments. A second surface 140b' of a semiconductor layer 140' has a lattice plane, in which the lattice plane of the second surface 140b' of a semiconductor layer 140' is one of a {110} family of planes of a cubic system, and pit portions 144a are square based pyramid pit portions. The pit portions 144a are regularly arranged on the second surface 140b'. For example, the pit portions 144a may be arranged in an array. In the examples, four edges 145a, 145b, 145c, and 145d of a base 145 of each of the pit portions 144a are non-parallel with four edges 146a, 146b, 146c, and 146d of the pixel region 146.

Figure 3A:
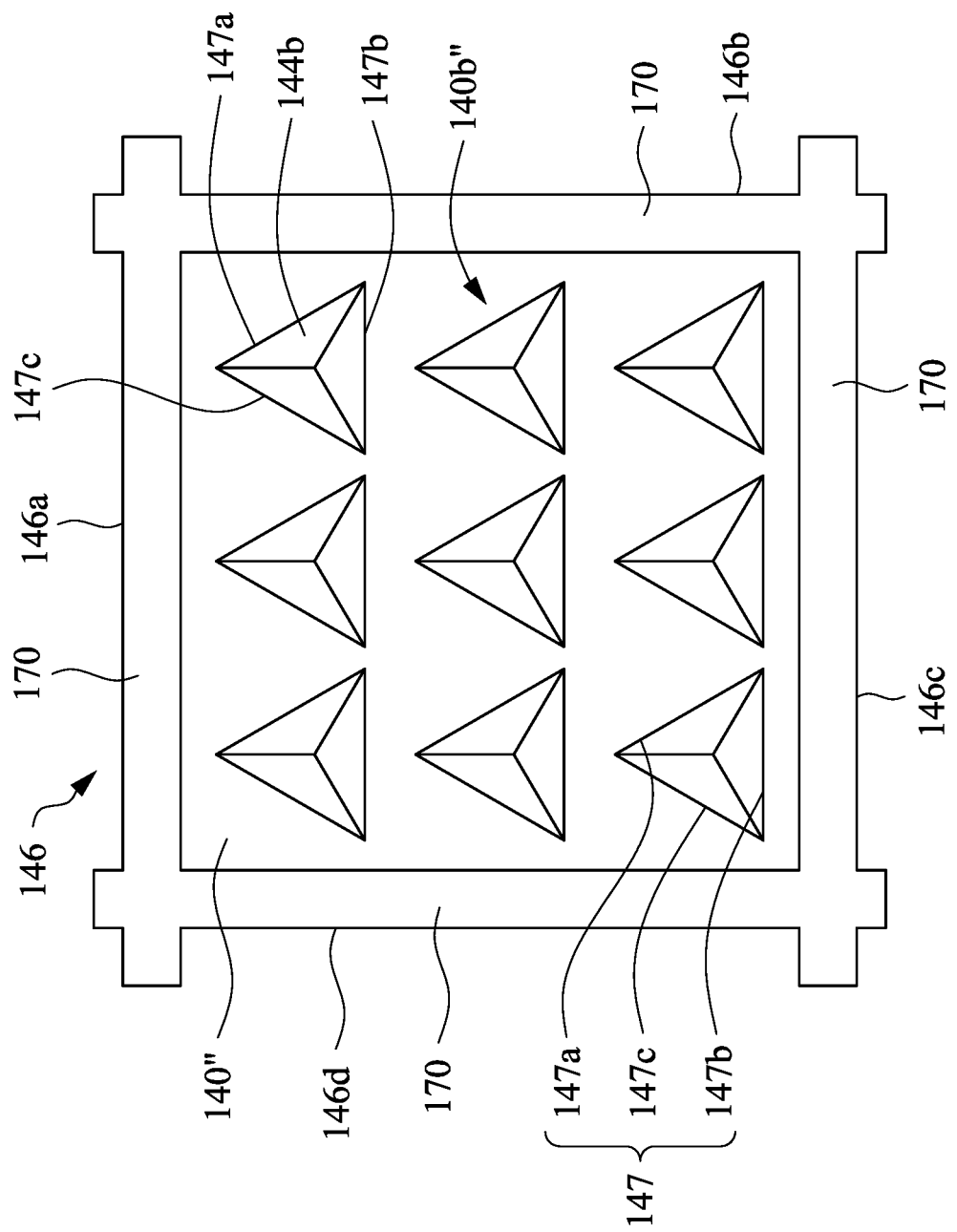
FIG. 3A is an enlarged schematic top view of a semiconductor layer and isolation structures in a pixel region of a semiconductor device in accordance with various embodiments.
Figure 3B:
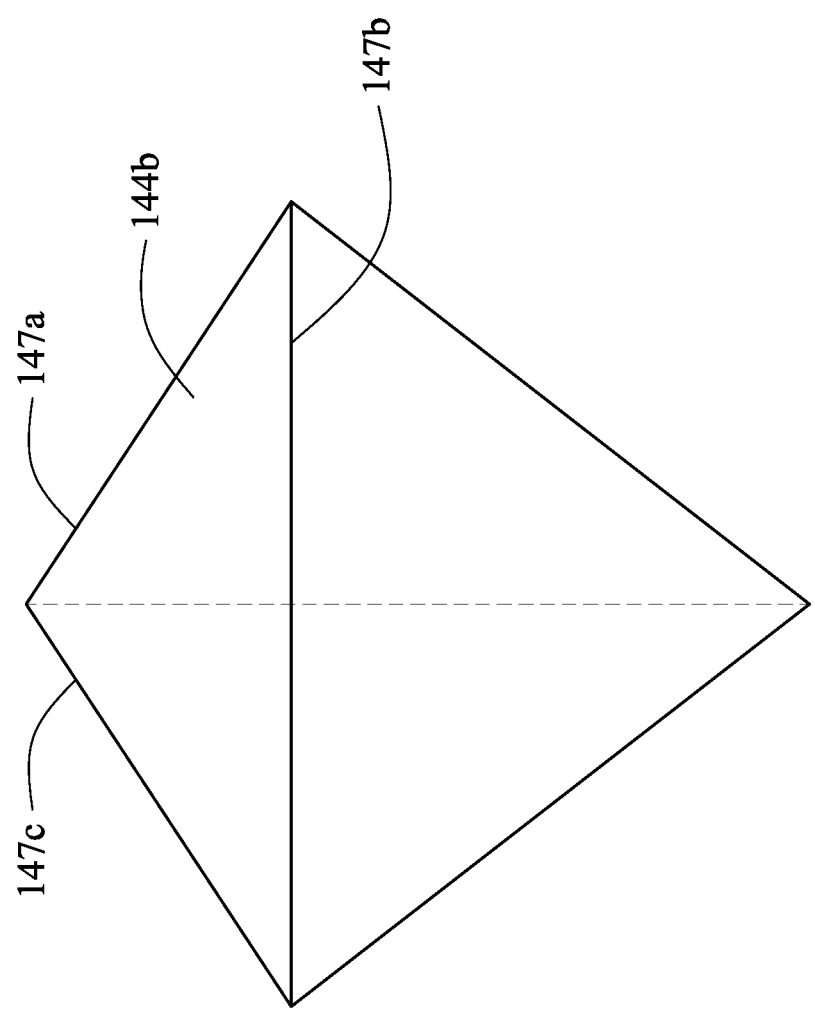
FIG. 3B is an enlarged schematic three-dimensional view of a pyramid pit portion of a semiconductor layer of a semiconductor device in accordance with various embodiments.

Referring to FIG. 3A and FIG. 3B, FIG. 3A is an enlarged schematic top view of a semiconductor layer and isolation structures in a pixel region of a semiconductor device in accordance with various embodiments, and FIG. 3B is an enlarged schematic three-dimensional view of a pyramid pit portion of a semiconductor layer of a semiconductor device in accordance with various embodiments. A second surface 140b'' of a semiconductor layer 140'' has a lattice plane, in which the lattice plane of the second surface 140b'' of the semiconductor layer 140'' is one of a {111} family of planes of a cubic system, and pit portions 144b are triangular based pyramid pit portions. The pit portions 144b are regularly arranged on the second surface 140b''. For example, the pit portions 144b may be arranged in an array. In the examples, one edge 147b of a base 147 of each of the pit portions 144b is substantially parallel to two opposite edges 146a and 146c of the pixel region 146, and the other two edges 147a and 147c of the base 147 of each of the pit portions 144b are non-parallel with the two opposite edges 146a and 146c and the other two opposite edges 146b and 146d of the pixel region 146.

Figure 4A:
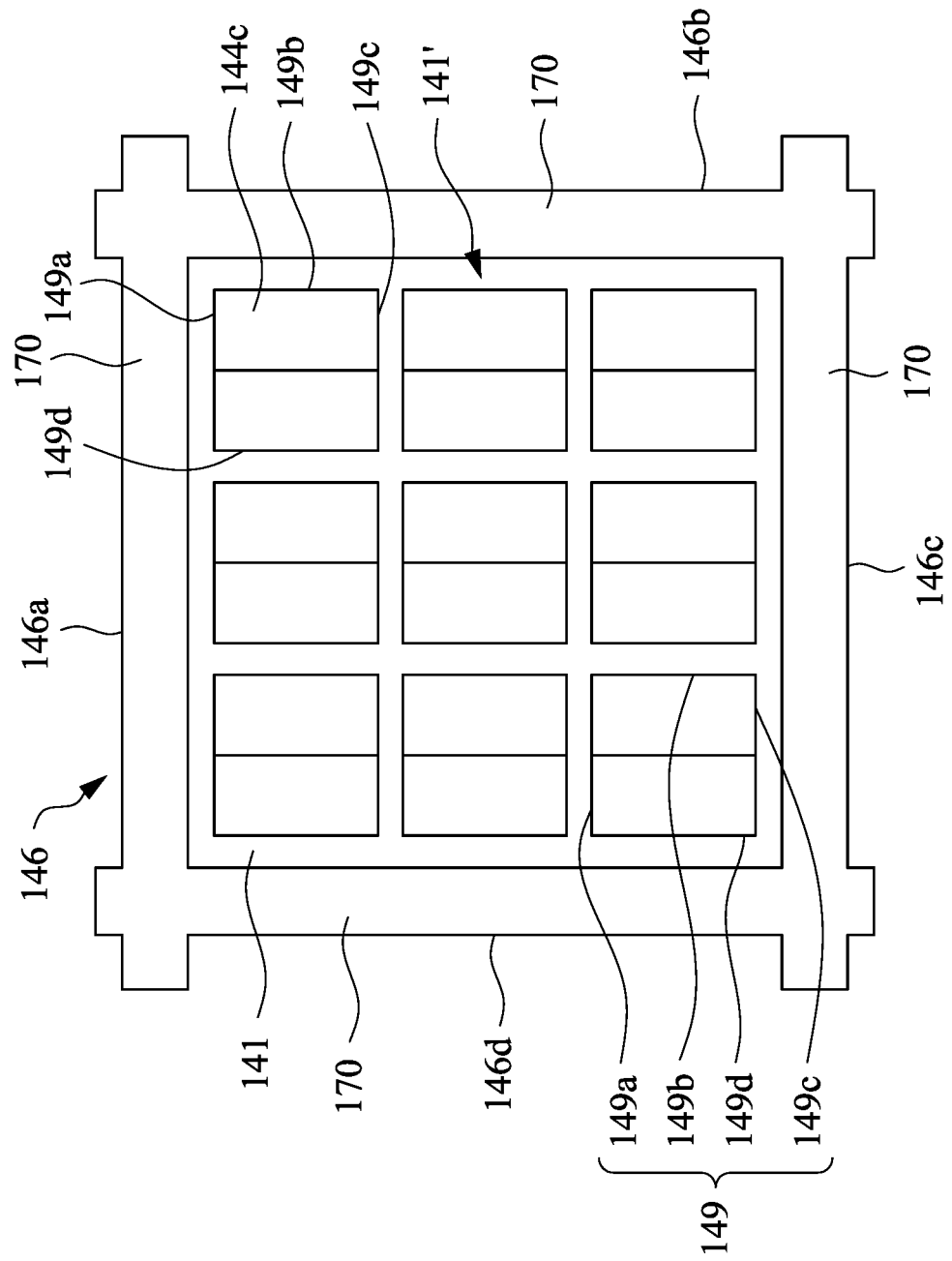
FIG. 4A is an enlarged schematic top view of a semiconductor layer and isolation structures in a pixel region of a semiconductor device in accordance with various embodiments.
Figure 4B:
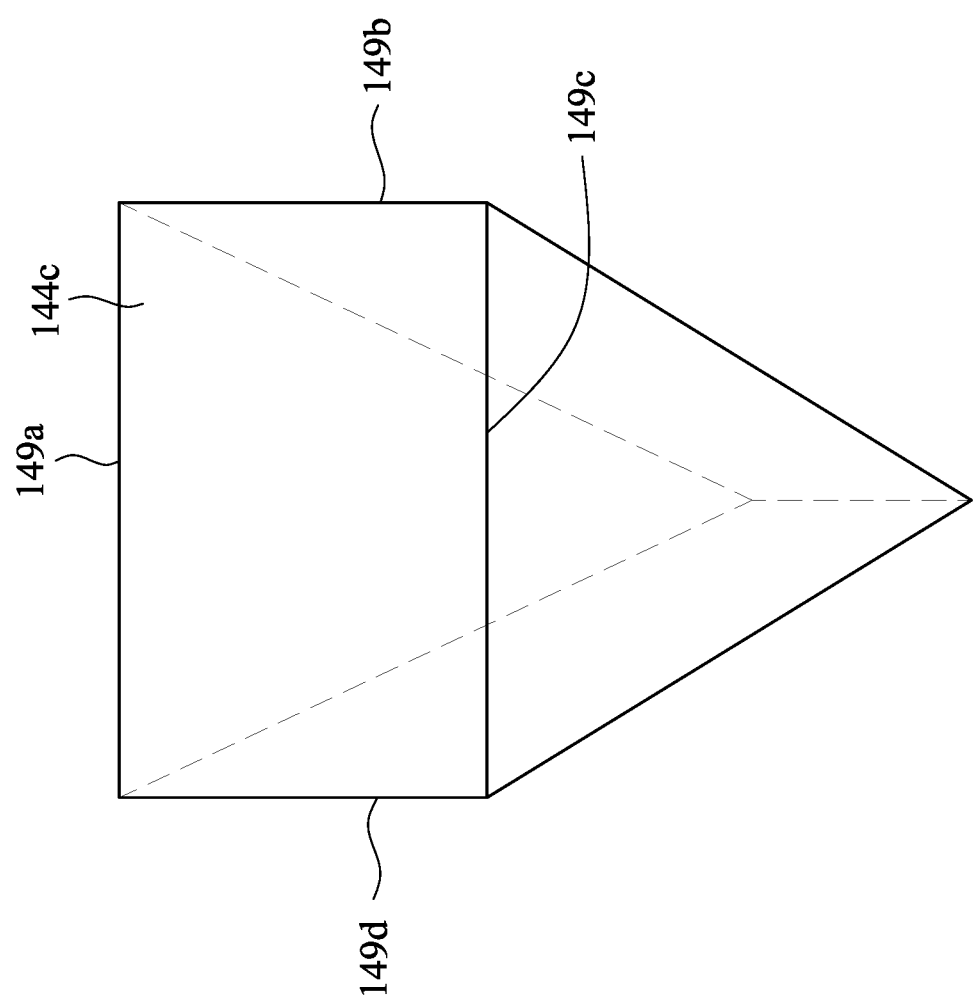
FIG. 4B is an enlarged schematic three-dimensional view of a pyramid pit portion of a semiconductor layer of a semiconductor device in accordance with various embodiments.

Referring to FIG. 4A and FIG. 4B, FIG. 4A is an enlarged schematic top view of a semiconductor layer and isolation structures in a pixel region of a semiconductor device in accordance with various embodiments, and FIG. 4B is an enlarged schematic three-dimensional view of a pyramid pit portion of a semiconductor layer of a semiconductor device in accordance with various embodiments. A second surface 141' of a semiconductor layer 141 has a lattice plane, in which the lattice plane of the second surface 141' of the semiconductor layer 141 is one of a {110} family of planes of a cubic system, and pit portions 144c are square based prism pit portion. The pit portions 144c are regularly arranged on the second surface 141'. For example, the pit portions 144c may be arranged in an array. In the examples, two edges 149a and 149c of a base 149 of each of the pit portions 144c are substantially parallel with two edges 146a and 146c of the pixel region 146, and the other two edges 149b and 149d of the base 149 of each of the pit portions 144c are substantially parallel with two edges 146b and 146d of the pixel region 146.

In order to increase the rate and the resolution of the semiconductor device 100, the semiconductor layer 140 having the second surface 140b has the lattice plane, which is tilted with respect to the basal plane, is used. Thus, an etching process performed on the second surface 140b of the semiconductor layer 140 forms various pit portions 144 on the second surface 140b of the semiconductor layer 140, such that most of the incident light 110 is scattered and refracted by the pit portions 144, and then enters the semiconductor layer 140 and is absorbed by the semiconductor layer 140. Accordingly, quantum efficiency of the semiconductor device 100 is significantly enhanced due to low reflection and high absorption, and the rate and the resolution of the semiconductor device 100 are increased.

In some examples, as shown in FIG. 1, the semiconductor device 100 optionally includes a buffer layer 180. The buffer layer 180 overlies and covers the second surface 140b of the semiconductor layer 140 and the isolation structures 170. The buffer layer 180 may be directly disposed on and contact the second surface 140b of the semiconductor layer 140. In some exemplary examples, the second surface 140b of the semiconductor layer 140 is covered by some portions of the isolation structures 170, and the buffer layer 180 is disposed on the isolation structures 170. The buffer layer 180 may be transparent and may include a dielectric material, such as silicon oxide, silicon nitride, silicon oxynitride, silicon carbide, or any combinations thereof.

Referring to FIG. 1 again, the semiconductor device 100 may optionally include a metal grid layer 190, in which the metal grid layer 190 is disposed on portions of the buffer layer 180. The metal grid layer 190 may block the incident light 110, and thus prevents the optical interference between the pixel regions 146. For example, the metal grid layer 190 may include W, Ti, TiN, Ta, TaN, Al, Cu, AlCu, Ni, or any combinations or alloys thereof.

As shown in FIG. 1, the semiconductor device 100 may optionally include a passivation layer 195. The passivation layer 195 is disposed on and covering the metal grid layer 190 and the buffer layer 180. The passivation layer 195 may be used to protect the metal grid layer 190 and the buffer layer 180. The passivation layer 195 may be a dielectric film, such as silicon oxide, silicon nitride, silicon oxynitride, silicon carbide, or any combinations thereof.

Figure 5A:
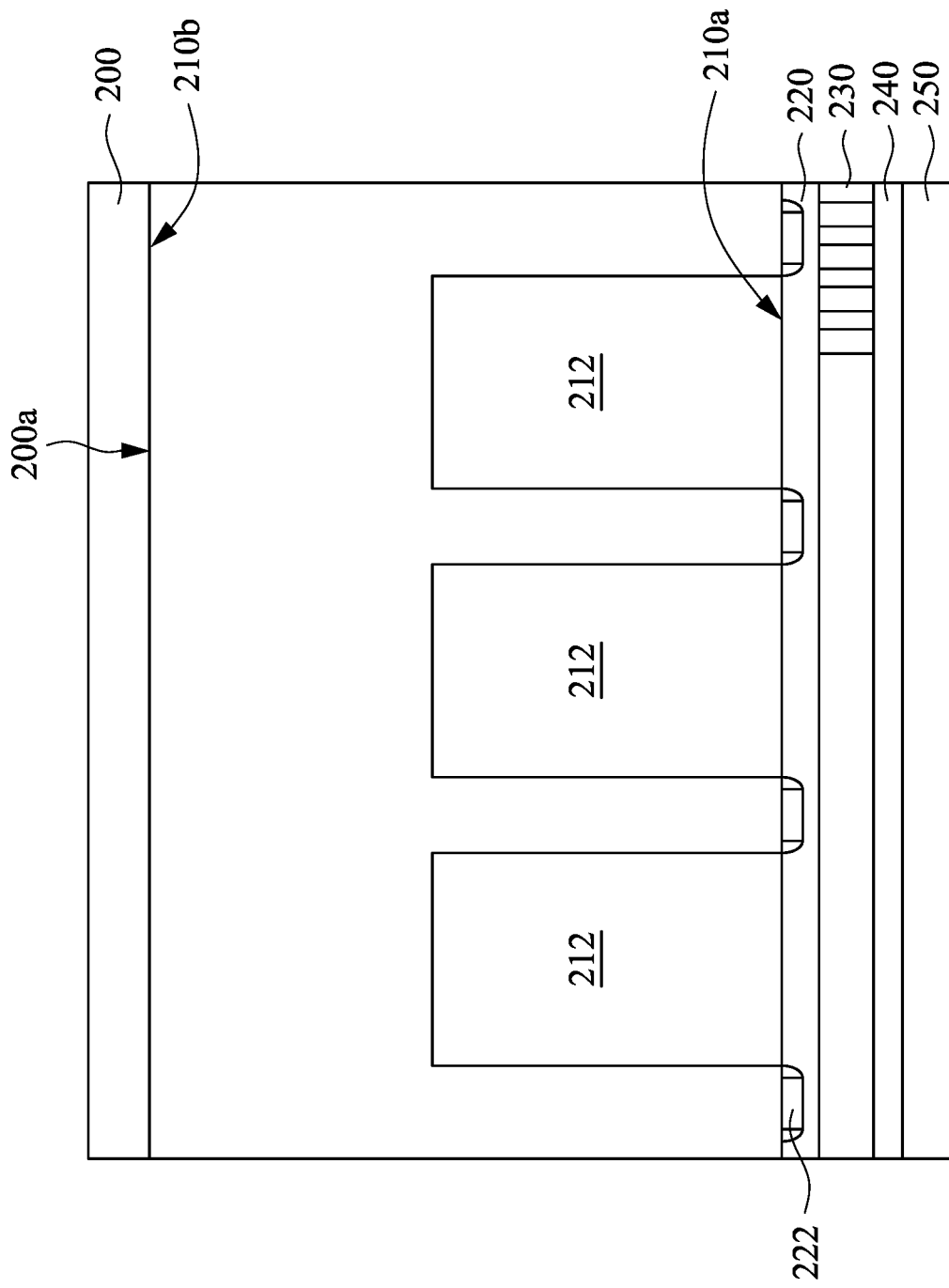
FIG. 5A through FIG. 5K are schematic cross-sectional views of intermediate stages showing a method for manufacturing a semiconductor device in accordance with various embodiments.

FIG. 5A through FIG. 5K are schematic cross-sectional views of intermediate stages showing a method for manufacturing a semiconductor device in accordance with various embodiments. As shown in FIG. 5A, a substrate 200 is provided. The substrate 200 may be provided to include a group IV material, a group IV material compound, or a group III-V material compound. For example, the group IV material may be Si or Ge, the group IV material compound may be SiGe, and the group III-V material compound may be sapphire.

A semiconductor layer 210 is formed on a surface 200a of the substrate 200. The semiconductor layer 210 is formed to include various light-sensing regions 212. Each of the light-sensing regions 212 may be formed to include a photodiode. In some exemplary examples, the light-sensing regions 212 are formed by performing an implant process on the semiconductor layer 210. The semiconductor layer 210 has a first surface 210a and a second surface 210b, in which the first surface 210a and the second surface 210b are opposite to each other. In the embodiments, the second surface 210b of the semiconductor layer 210 has a lattice plane which is tilted with respect to a basal plane. In some examples, the lattice plane of the second surface 210b of the semiconductor layer 210 is one of a {110} family of planes of a cubic system or one of a {111} family of planes of the cubic system. The semiconductor layer 210 may be formed to include a group IV material, a group IV material compound, or a group III-V material compound. For example, the group IV material and the group IV material compound may include Si, Ge, or SiGe. The group III-V material compound may include GaN, GaAs, InAs, InGaN, or InGaAs.

A device layer 220 is formed on the first surface 210a of the semiconductor layer 210, such that the first surface 210a is adjacent to the device layer 220. The device layer 220 is formed to include various devices 222, such as transistors. Referring to FIG. 5A again, at least one inter-metal dielectric layer 230 may be optionally formed on the device layer 220. The inter-metal dielectric layer 230 may be formed to include conductive lines, in which conductive lines are electrically connected to the devices 222 of the device layer 220. The inter-metal dielectric layer 230 is formed to include a dielectric film, such as silicon oxide, silicon nitride, silicon oxynitride, silicon carbide, or any combinations thereof.

In some exemplary examples, as shown in FIG. 5A, a passivation layer 240 is optionally formed on the inter-metal dielectric layer 230. The passivation layer 240 may be formed by using a deposition process, such as a chemical vapor deposition (CVD) process. The passivation layer 240 may be formed to include a dielectric film, such as silicon oxide, silicon nitride, silicon oxynitride, silicon carbide, or any combinations thereof.

In some examples, as shown in FIG. 5A, a carrier 250 is provided. The substrate 200 and the structure formed thereon, which includes the semiconductor layer 210, the device layer 220, the inter-metal dielectric layer 230, and the passivation layer 240, are flipped and are bonded to the carrier 250. The passivation layer 240 is suitable for bonding the inter-metal dielectric layer 230 and the carrier 250. After the inter-metal dielectric layer 230 is bonded to the carrier 250 by using the passivation layer 240, the device layer 220 and the semiconductor layer 210 are disposed on the carrier 250.

Figure 5B:
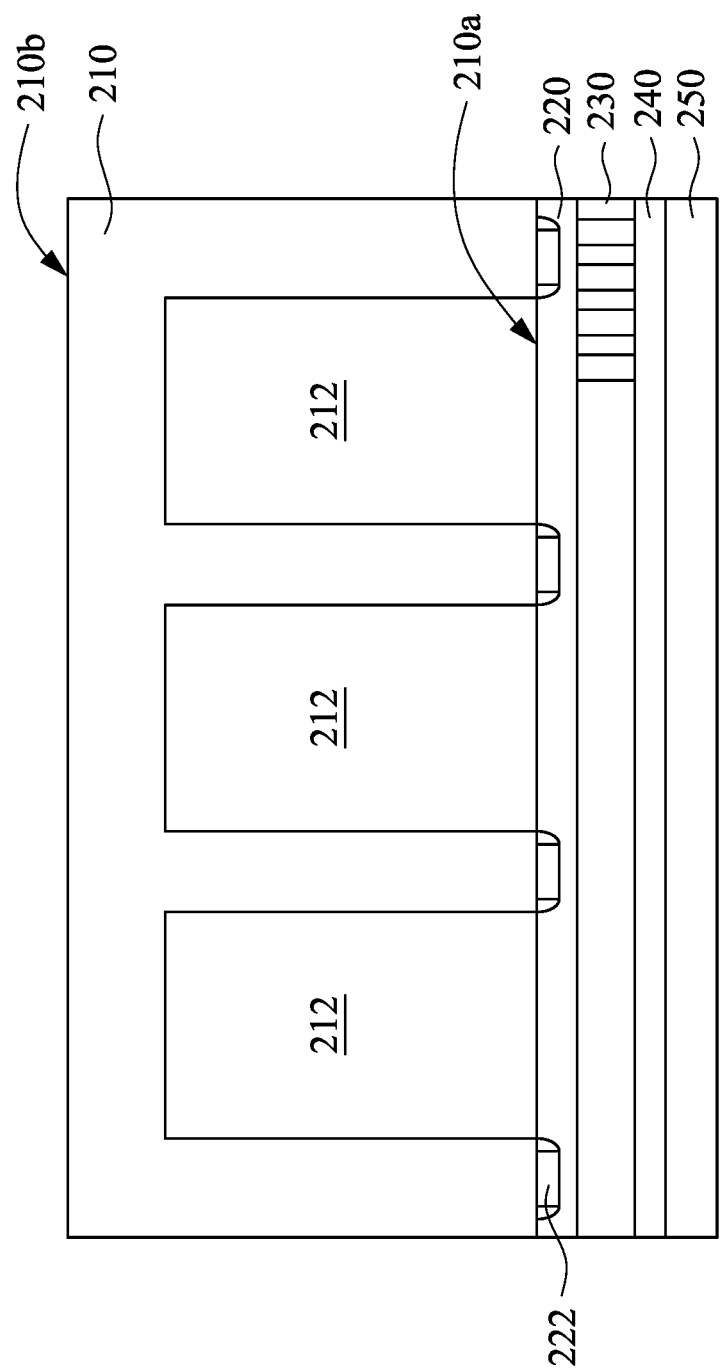

As shown in FIG. 5B, the substrate 200 is removed to expose the second surface 210b of the semiconductor layer 210. For example, the substrate 200 may be removed by using an etching process or a polishing process. The polishing process may be a chemical mechanical polishing (CMP) process. Optionally, a thinning process may be performed on the second surface 210b of the semiconductor layer 210 to reduce a thickness of the semiconductor layer 210. For example, the thinning process may be performed by using an etching process or a polishing process. In certain examples, removing the substrate 200 and thinning the semiconductor layer 210 may be performed by one single process.

Figure 5C:
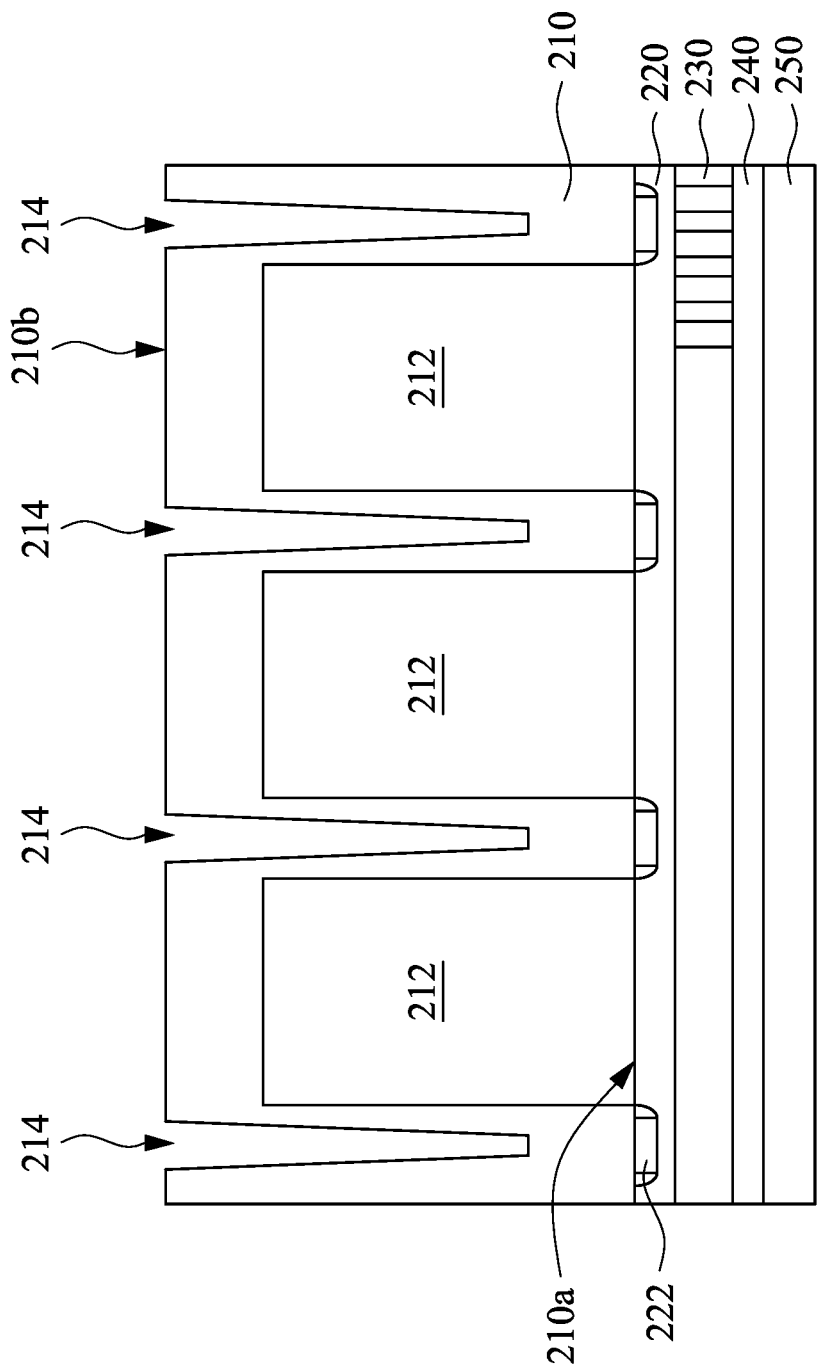
Figure 5D:
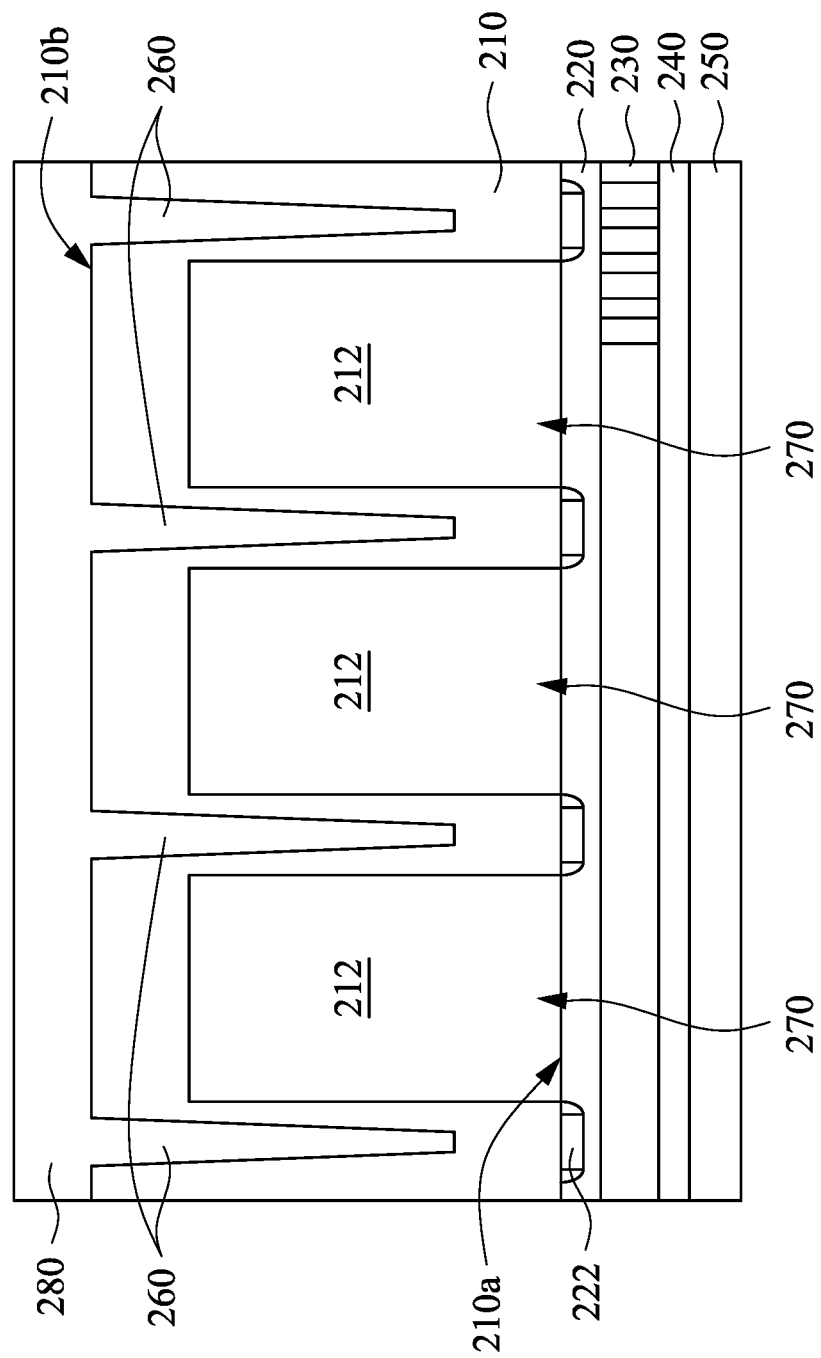

In some examples, as shown in FIG. 5C, after the substrate 200 is removed, various trenches 214 may be optionally formed in the semiconductor layer 210 to define various pixel regions 270. For example, the trenches 214 may be formed by removing portions of the semiconductor layer 210 using a photolithography process and an etching process. The trenches 214 extend from the second surface 210b of the semiconductor layer 210 to a predetermined thickness of the semiconductor layer 210. The trenches 214 may be deep trenches. After the trenches 214 are formed, the trenches 214 are respectively filled with isolation fillers 260, as shown in FIG. 5D. Each of the pixel regions 270 may include one of the light-sensing regions 212, and each of the isolation fillers 260 isolates two adjacent ones of the light-sensing regions 212. For example, each of the pixel regions 270 may be formed as a rectangular region surrounded by the isolation fillers 260.

Figure 5E:
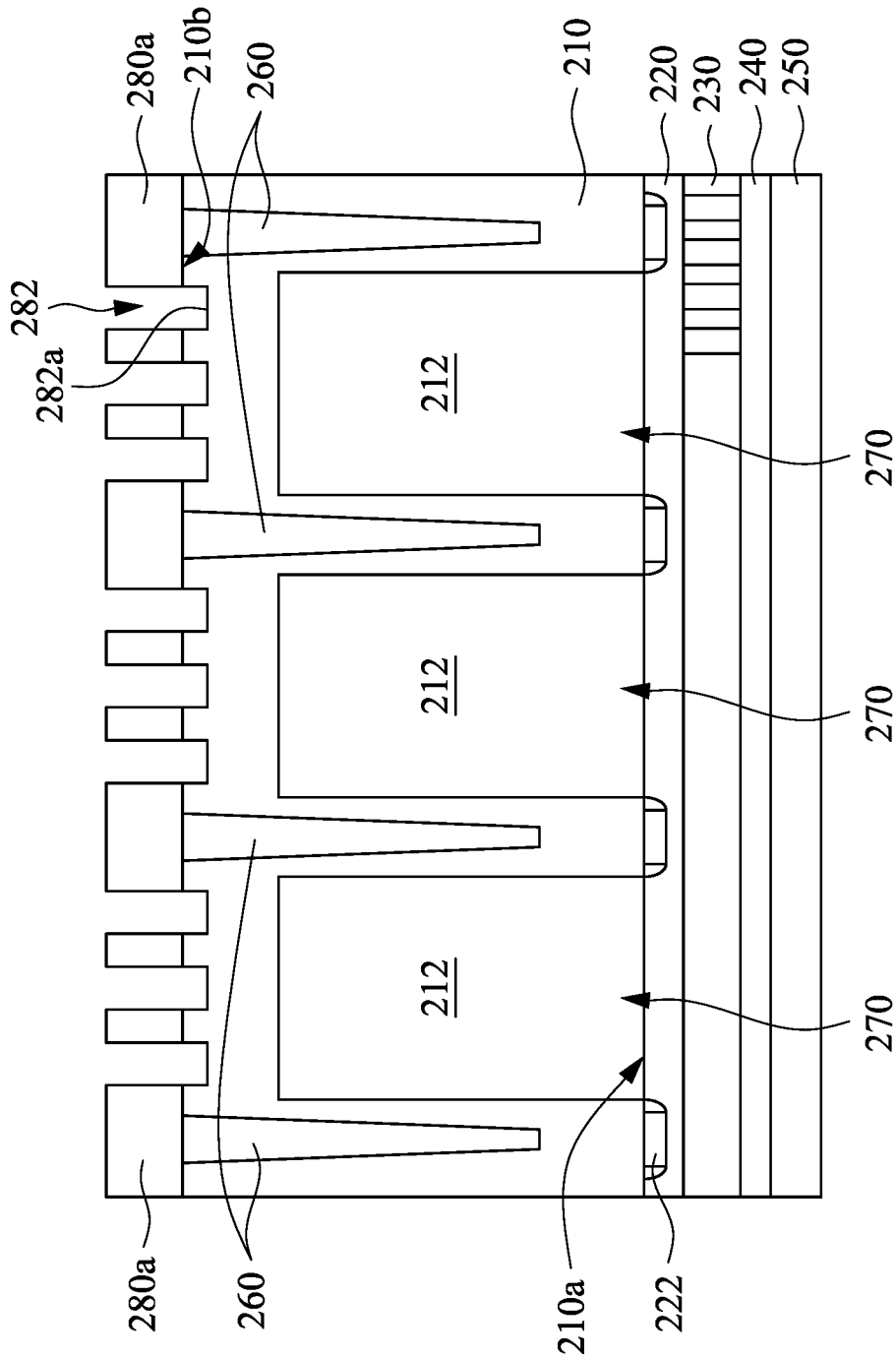
Figure 5F:
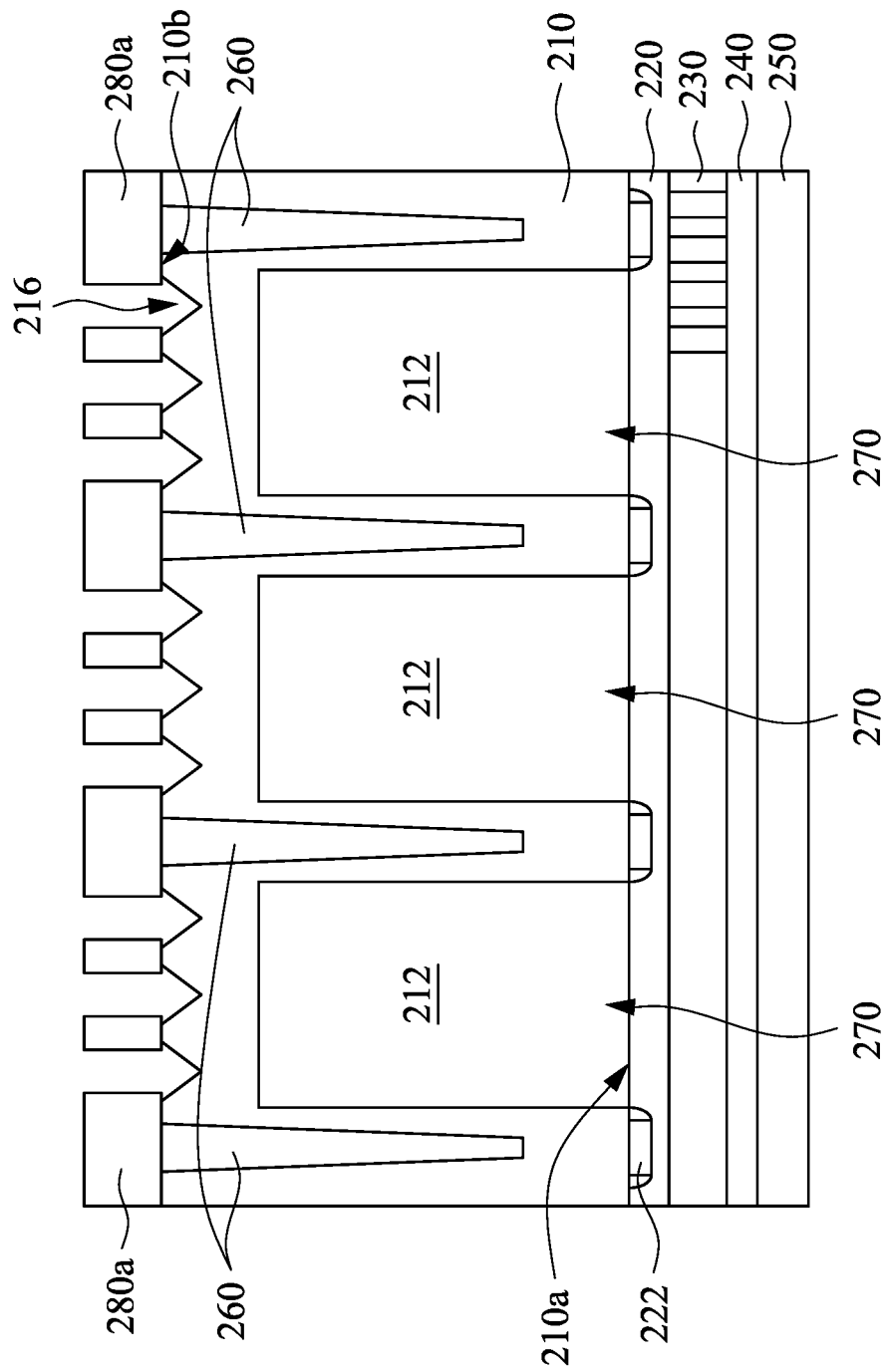

Referring to FIG. 5D through FIG. 5F, an etching process is performed on the second surface 210b of the semiconductor layer 210 to form various pit portions 216 on the second surface 210b of the semiconductor layer 210. In some examples, in the etching process, a hard mask material layer 280 is formed to cover the second surface 210b of the semiconductor layer 210 and the isolation fillers 260, as shown in FIG. 5D. The hard mask material layer 280 may be formed by using a deposition technique, such as a chemical vapor deposition technique. The hard mask material layer 280 may be formed to include a dielectric film, such as silicon oxide, silicon nitride, silicon oxynitride, silicon carbide, or any combinations thereof.

As shown in FIG. 5E, the hard mask material layer 280 and the semiconductor layer 210 are patterned to remove portions of the hard mask material layer 280 and the underlying semiconductor layer 210, so as to form various concavities 282 exposing portions of the semiconductor layer 210. The portions of the hard mask material layer 280 are removed to form a hard mask layer 280a. The hard mask layer 280a is disposed on portions of the second surface 210b of the semiconductor layer 210 and covers the isolation fillers 260. Each of the concavities 282 extends from the hard mask layer 280a to the semiconductor layer 210, and a bottom 282a of each of the concavities 282 is near the second surface 210b of the semiconductor layer 210. In some exemplary examples, patterning the hard mask material layer 280 and the semiconductor layer 210 includes using a photolithography technique and an etching technique, such as a dry etching technique.

As shown in FIG. 5F, an etching operation is performed on the exposed portions of the semiconductor layer 210. In some examples, the etching operation is a wet etching operation, and the semiconductor layer 210 exposed by the concavities 282 are isotropically etched, so as to form various pit portions 216 on the second surface 210b of the semiconductor layer 210. For example, the pit portions 216 may be pyramid pit portions or prism pit portions. The pit portions 216 are arranged on the second surface 210b of the semiconductor layer 210. In some examples, in each of the pixel regions 270, the pit portions 216 are regularly arranged on the second surface 210b of the semiconductor layer 210. For example, the pit portions 216 may be arranged in an array. Any two adjacent ones of the pit portions 216 may adjoin to each other or may be separated from each other. In addition, shapes of the pit portions 216 of the semiconductor layer 210 are substantially the same.

In the embodiments, the second surface 210b of the semiconductor layer 210 has a lattice plane which is tilted with respect to the basal plane, thus the pit portions 216 with different layouts and different shapes are obtained after the etching process due to different etching rates at different orientations of the second surface 210b of the semiconductor layer 210. In some examples, the lattice plane of the second surface 210b of the semiconductor layer 210 is one of a {110} family of planes of a cubic system or one of a {111} family of planes of the cubic system. Referring to FIG. 2A, FIG. 2B, and FIG. 5F simultaneously, in the examples that the lattice plane of the second surface 210b of the semiconductor layer 210 is one of the {110} family of planes of the cubic system, the pit portions 216 are square based pyramid pit portions, which are similar to the pit portions 144a shown in FIG. 2A and FIG. 2B. In addition, four edges of a base of each of the pit portions 216 are non-parallel with four edges of the pixel region 270.

Referring to FIG. 3A, FIG. 3B, and FIG. 5F simultaneously, in the examples that the lattice plane of the second surface 210b of the semiconductor layer 210 is one of the {111} family of planes of the cubic system, the pit portions 216 are triangular based pyramid pit portions, which are similar to the pit portions 144b shown in FIG. 3A and FIG. 3B. In addition, one edge of the as base of each of the pyramid pit portions 216 is substantially parallel to two opposite edges of the pixel region 270.

Referring to FIG. 4A, FIG. 4B, and FIG. 5F simultaneously, in the examples that the lattice plane of the second surface 210b of the semiconductor layer 210 is one of the {110} family of planes of the cubic system, the pit portions 216 are square based prism pit portion, which are similar to the pit portions 144c shown in FIG. 4A and FIG. 4B. In addition, two opposite edges of the base of each of the pit portions 216 are substantially parallel to two opposite edges of the pixel region 270, and the other two opposite edges of the base of each of the pit portions 216 are substantially parallel to the other two opposite edges of the pixel region 270.

Figure 5G:
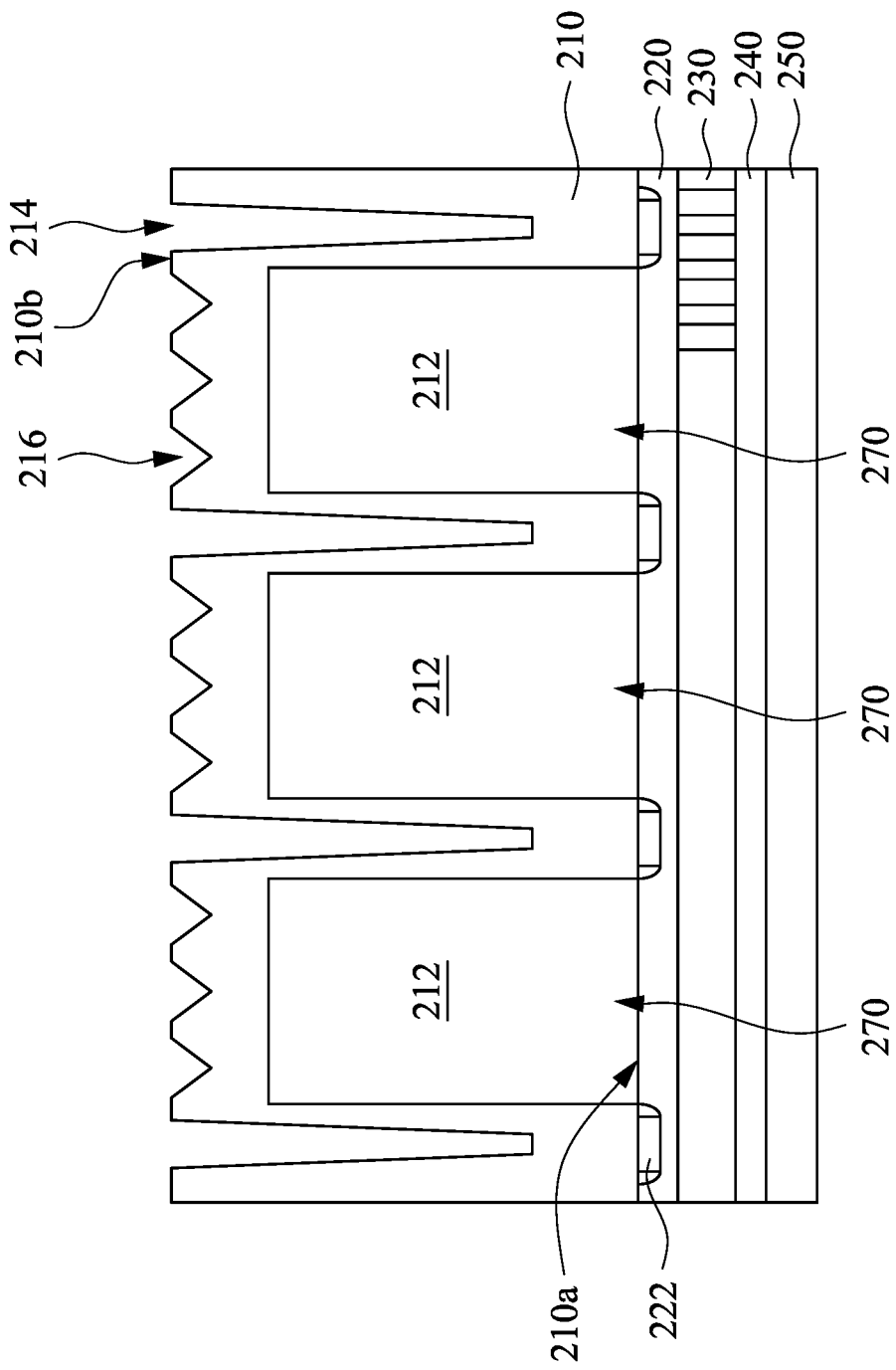
Figure 5H:
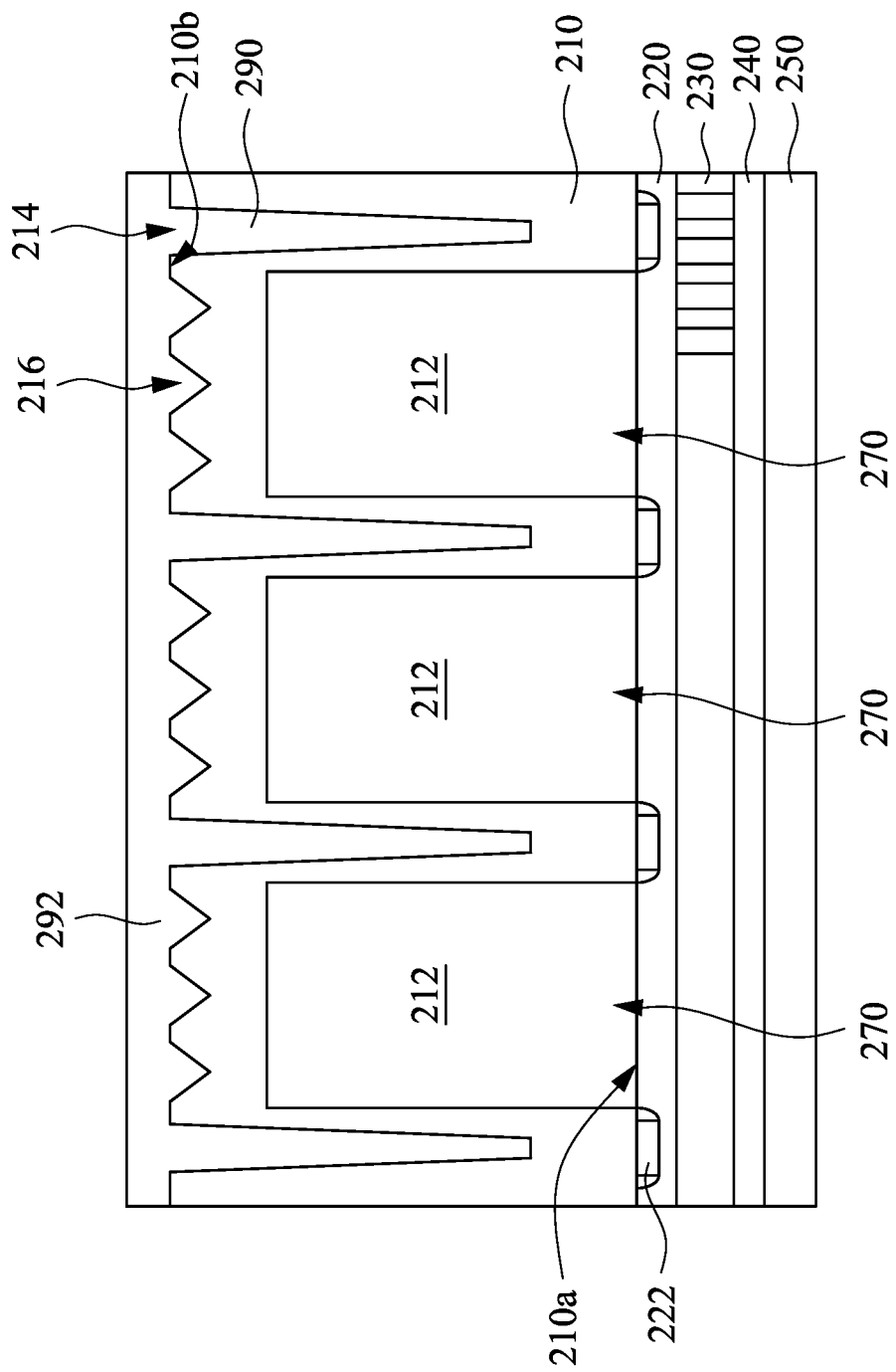

As shown in FIG. 5G, after the pit portions 216 are completed, the hard mask layer 280a is removed to expose the isolation fillers 260. In some exemplary examples, as shown in FIG. 5G, the isolation fillers 260 are removed from the trenches 214 by using, for example, an etching technique. Then, the trenches 214 are filled with various isolation structures 290. The isolation structures 290 may be formed by using a deposition technique, such as a chemical vapor deposition technique. In some exemplary examples, each of the isolation structures 290 is a deep trench isolation structure extending from the second surface 210b of the semiconductor layer 210 to a predetermined depth of the semiconductor layer 210, so as to isolate two adjacent ones of the light-sensing regions 212. In certain examples, as shown in FIG. 5H, in forming the isolation structures 290, a dielectric layer 292 is formed on the second surface 210b of the semiconductor layer 210, in which the trenches 214 are filled with the dielectric layer 292, such that the isolation structures 290 are respectively formed in the trenches 214. The second surface 210b of the semiconductor layer 210 and the pyramid pit portions 216 are covered by the dielectric layer 292. For example, the dielectric layer 292 is formed to include a dielectric material, such as silicon oxide, silicon nitride, silicon oxynitride, silicon carbide, or any combinations thereof.

Figure 5I:
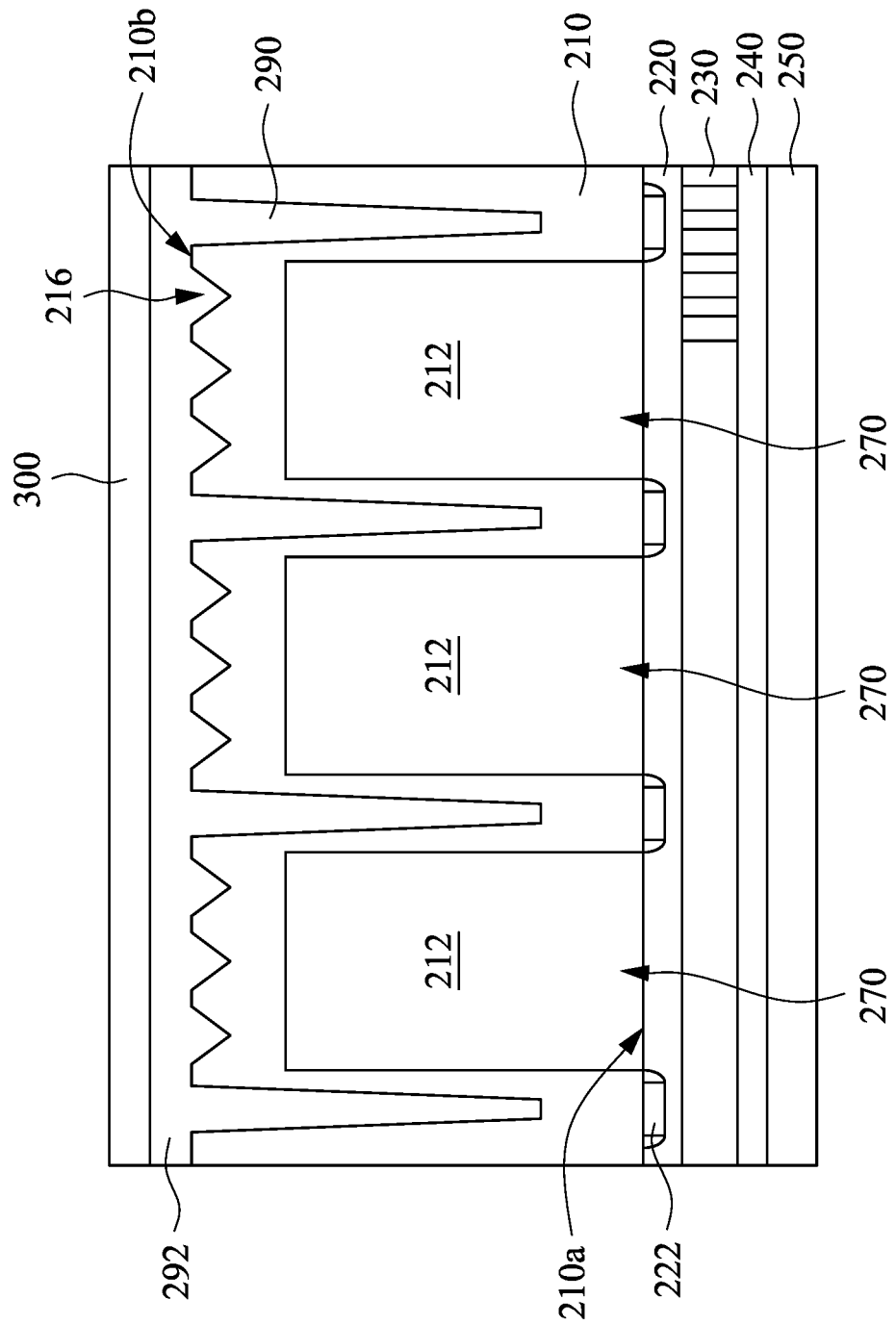

In some examples, as shown in FIG. 5I, a buffer layer 300 is optionally formed to cover the second surface 210b of the semiconductor layer 210 and the isolation structures 290. The buffer layer 300 may be formed to directly on and contact the second surface 210b of the semiconductor layer 210. In the examples that the second surface 210b of the semiconductor layer 210 is covered by the dielectric layer 292, the buffer layer 300 is formed on the dielectric layer 292. The buffer layer 300 may be formed by using a deposition technique. The buffer layer 300 may be transparent and may be formed to include a dielectric material, such as silicon oxide, silicon nitride, silicon oxynitride, silicon carbide, or any combinations thereof.

Figure 5J:
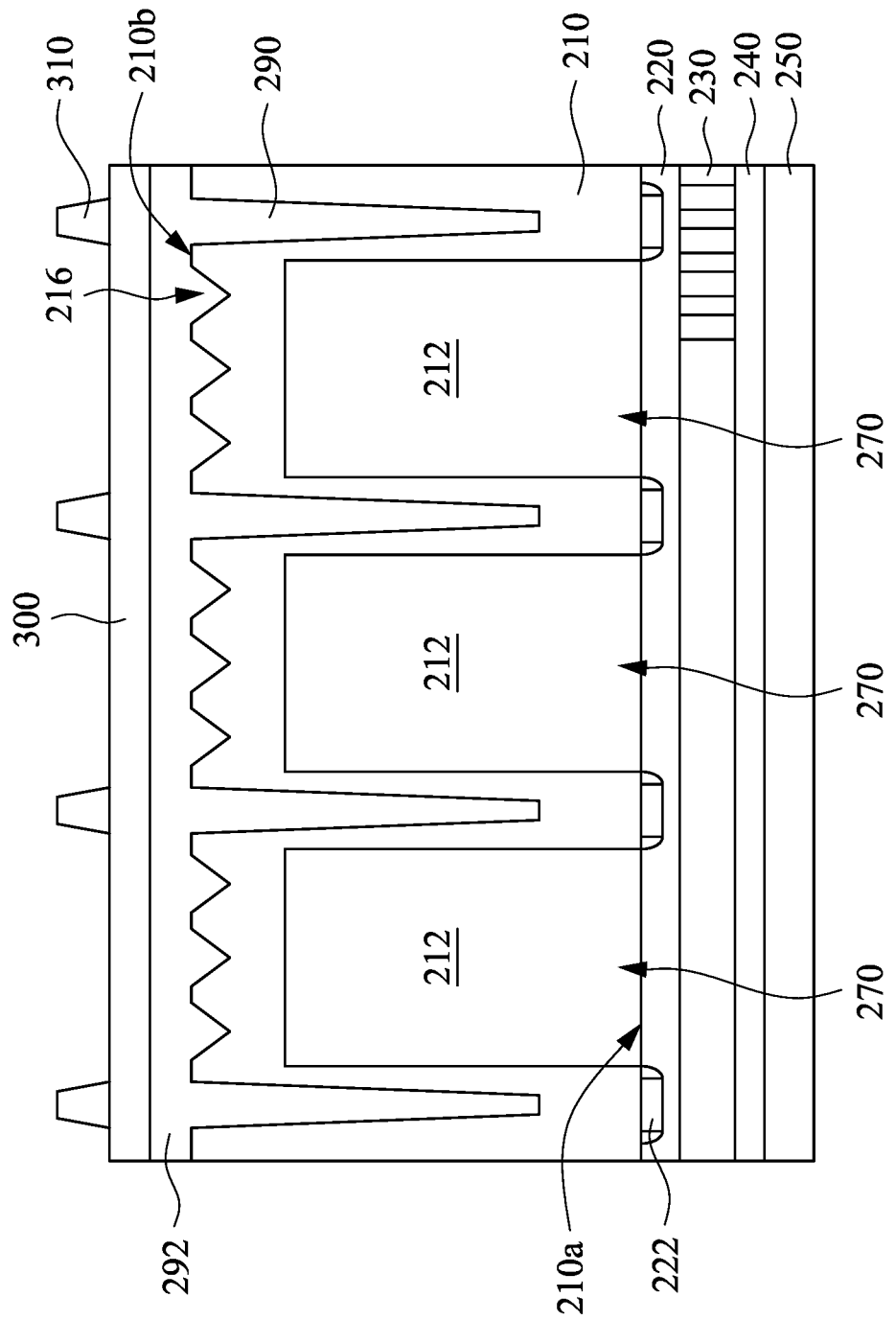

In some examples, as shown in FIG. 5J, a metal grid layer 310 is optionally formed on portions of the buffer layer 300. The metal grid layer 310 may be formed by using a deposition technique, a photolithography technique, and an etching technique, in which the deposition technique may be a physical vapor deposition technique or a chemical vapor deposition technique. For example, the metal grid layer 310 may be formed to include W, Ti, TiN, Ta, TaN, Al, Cu, AlCu, Ni, or any combinations or alloys thereof.

Figure 5K:
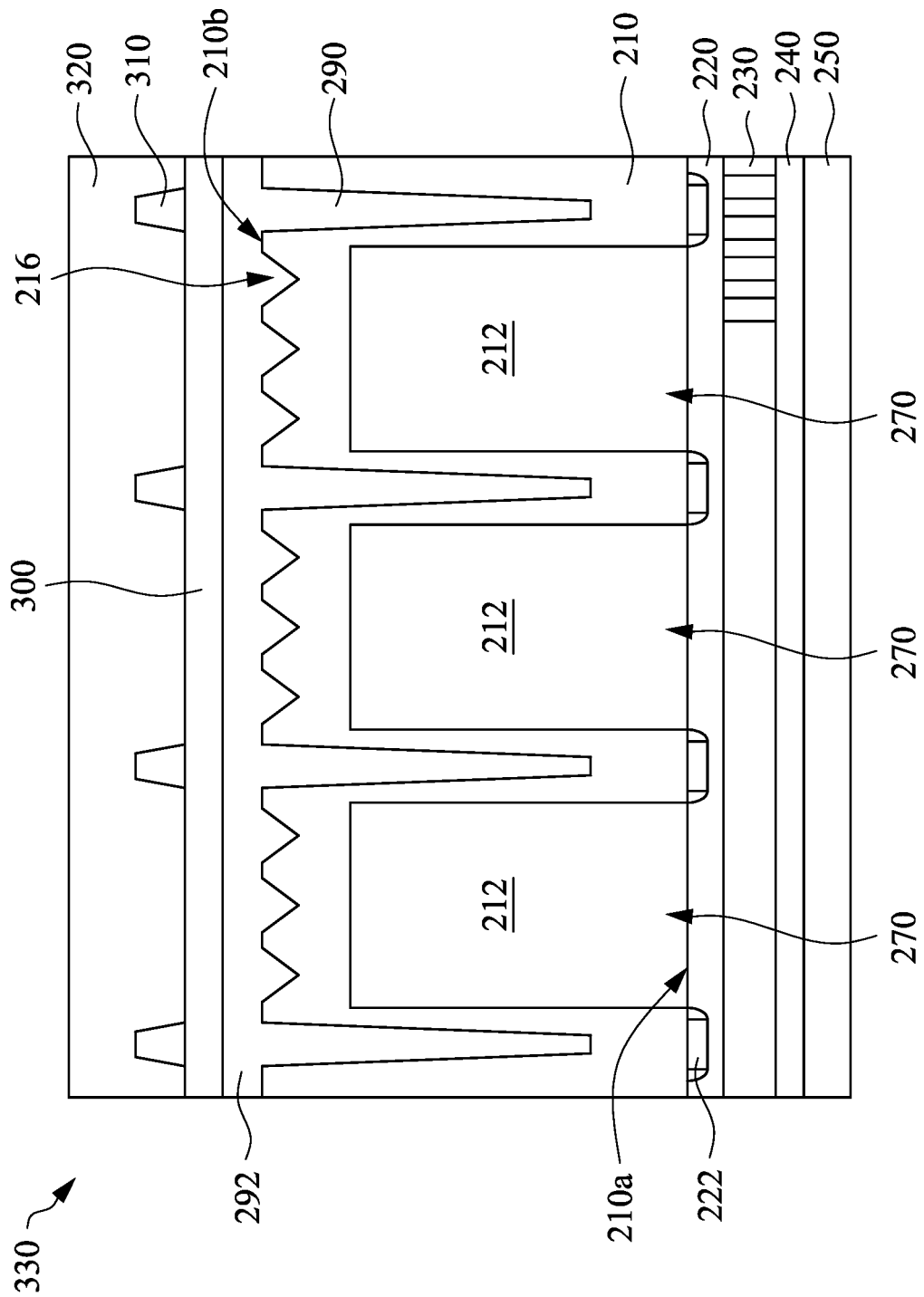

In some examples, as shown in FIG. 5K, a passivation layer 320 is optionally formed on and covering the buffer layer 300 and the metal grid layer 310, so as to substantially complete a semiconductor device 330. The passivation layer 320 may be formed to protect the metal grid layer 310 and the buffer layer 300. The passivation layer 320 may be formed to include a dielectric film, such as silicon oxide, silicon nitride, silicon oxynitride, silicon carbide, or any combinations thereof.

Figure 6:
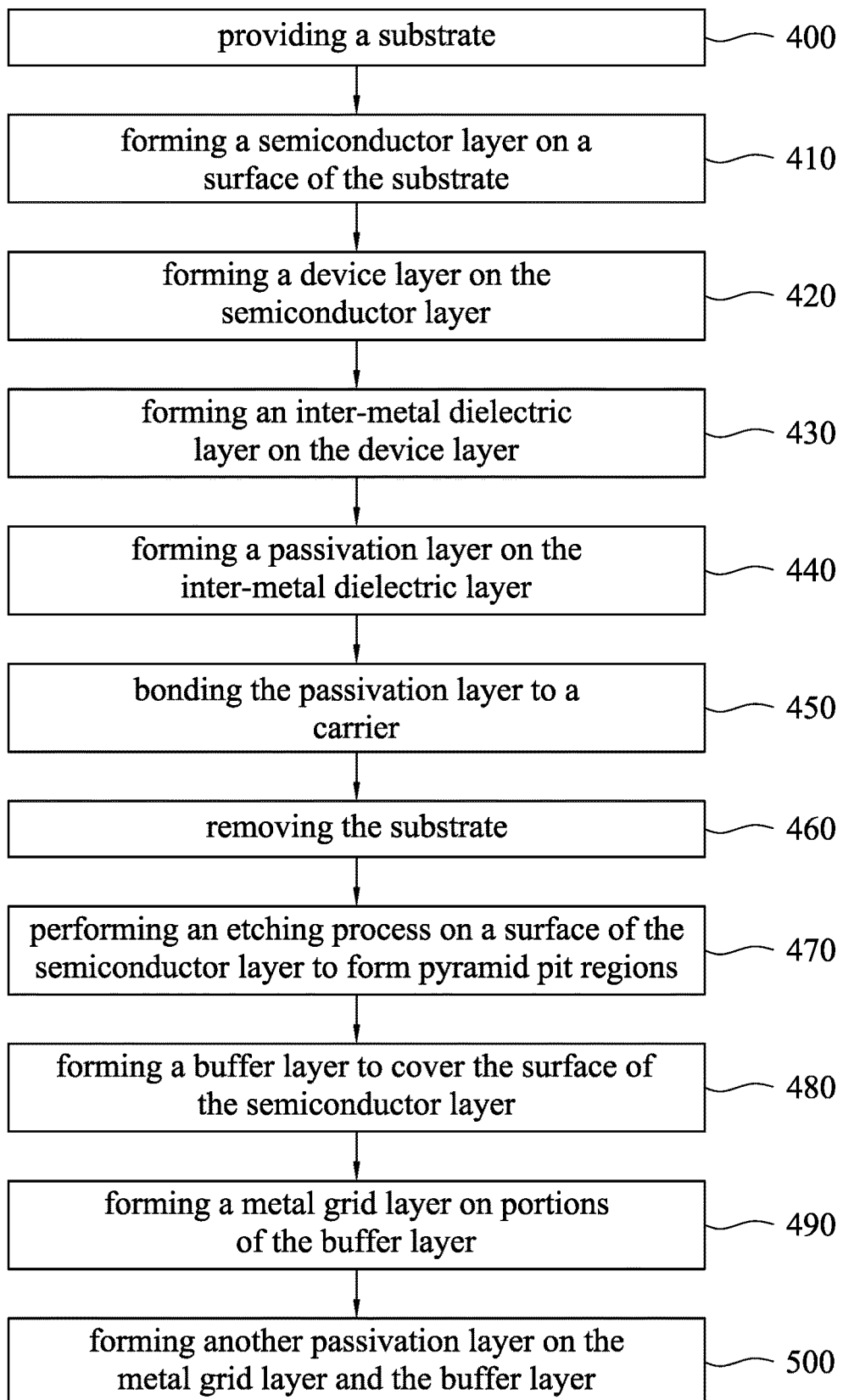
FIG. 6 is a flow chart of a method for manufacturing a semiconductor device in accordance with various embodiments.

Referring to FIG. 6 with FIG. 5A through FIG. 5K, FIG. 6 is a flow chart of a method for manufacturing a semiconductor device in accordance with various embodiments. The method begins at operation 400, where a substrate 200 is provided. The substrate 200 may be provided to include Si, Ge, SiGe, or sapphire.

At operation 410, as shown in FIG. 5A, a semiconductor layer 210 including various light-sensing regions 212 is formed on a surface 200a of the substrate 200. In some exemplary examples, the light-sensing regions 212 are formed by using an implant technique. Each of the light-sensing regions 212 may be formed to include a photodiode. The semiconductor layer 210 has a first surface 210a and a second surface 210b opposite to each other. In the embodiments, the second surface 210b of the semiconductor layer 210 is formed to have a lattice plane which is tilted with respect to a basal plane. In some examples, the lattice plane of the second surface 210b of the semiconductor layer 210 is one of a {110} family of planes of a cubic system or one of a {111} family of planes of the cubic system. For example, the semiconductor layer 210 may be formed to include Si, Ge, SiGe, GaN, GaAs, InAs, InGaN, or InGaAs.

At operation 420, as shown in FIG. 5A, a device layer 220 is formed on the first surface 210a of the semiconductor layer 210. The device layer 220 is formed to include various devices 222, such as transistors. At operation 430, as shown in FIG. 5A, at least one inter-metal dielectric layer 230 may be optionally formed on the device layer 220. The inter-metal dielectric layer 230 may be formed to include conductive lines, in which conductive lines are electrically connected to the devices 222 of the device layer 220. At operation 440, a passivation layer 240 may be optionally formed on the inter-metal dielectric layer 230 by using, for example, a chemical vapor deposition process.

At operation 450, referring to FIG. 5A again, a carrier 250 is provided. The substrate 200, and the semiconductor layer 210, the device layer 220, the inter-metal dielectric layer 230, and the passivation layer 240 formed thereon are flipped and are bonded to the carrier 250. After bonding, the device layer 220 and the semiconductor layer 210 are disposed on the carrier 250.

At operation 460, as shown in FIG. 5B, the substrate 200 is removed to expose the second surface 210b of the semiconductor layer 210, by using, for example, an etching process or a polishing process. The polishing process may be a chemical mechanical polishing process. A thinning process may be optionally performed on the second surface 210b of the semiconductor layer 210 to reduce a thickness of the semiconductor layer 210 by using, for example, an etching process or a polishing process. Removing the substrate 200 and thinning the semiconductor layer 210 may be performed by one single process, such as one chemical mechanical polishing process.

In some examples, as shown in FIG. 5C, various trenches 214 may be optionally formed in the semiconductor layer 210 to define various pixel regions 270. For example, the trenches 214 may be formed in the semiconductor layer 210 by removing portions of the semiconductor layer 210 using a photolithography process and an etching process. The trenches 214 may be deep trenches, and may extend from the second surface 210b of the semiconductor layer 210 to a predetermined thickness of the semiconductor layer 210. As shown in FIG. 5D, the trenches 214 are respectively filled with the isolation fillers 260. Each of the pixel regions 270 may include one of the light-sensing regions 212, and each of the isolation fillers 260 isolates two adjacent ones of the light-sensing regions 212. Each of the pixel regions 270 may be formed as a rectangular region surrounded by the isolation fillers 260.

At operation 470, referring to FIG. 5D through FIG. 5F, an etching process is performed on the second surface 210b of the semiconductor layer 210 to form various pit portions 216 on the second surface 210b of the semiconductor layer 210. In some examples, as shown in FIG. 5D, the etching process includes forming a hard mask material layer 280 to cover the second surface 210b of the semiconductor layer 210 and the isolation fillers 260 by using, for example, a chemical vapor deposition technique. The hard mask material layer 280 is formed from a material which is different from a material of the semiconductor layer 210.

As shown in FIG. 5E, the hard mask material layer 280 and the semiconductor layer 210 are patterned to remove portions of the hard mask material layer 280 and the underlying semiconductor layer 210, so as to form a hard mask layer 280a and various concavities 282 exposing portions of the semiconductor layer 210. The hard mask material layer 280 and the semiconductor layer 210 may be patterned by using a photolithography technique and an etching technique, such as a dry etching technique. The hard mask layer 280a is formed to cover portions of the second surface 210b of the semiconductor layer 210 and the isolation fillers 260. The concavities 282 are shallow, and a bottom 282a of each of the concavities 282 is near the second surface 210b of the semiconductor layer 210.

As shown in FIG. 5F, an etching operation is performed on the exposed portions of the semiconductor layer 210. In some examples, the etching operation is a wet etching operation, and the semiconductor layer 210 exposed by the concavities 282 are isotropically etched, so as to form various pit portions 216 on the second surface 210b of the semiconductor layer 210. For example, the pit portions 216 may be pyramid pit portions or prism pit portions. In each of the pixel regions 270, the pit portions 216 may be regularly arranged on the second surface 210b of the semiconductor layer 210. The pit portions 216 may adjoin to each other or may be separated from each other. Shapes of the pit portions 216 of the semiconductor layer 210 are substantially the same.

In the embodiments, the second surface 210b of the semiconductor layer 210 has a lattice plane which is tilted with respect to the basal plane, thus the pit portions 216 with different layouts and different shapes are obtained after the etching process due to different etching rates at different orientations of the second surface 210b of the semiconductor layer 210. In some examples, the lattice plane of the second surface 210b of the semiconductor layer 210 is one of a {110} family of planes of a cubic system or one of a {111} family of planes of the cubic system. Referring to FIG. 2A, FIG. 2B, and FIG. 5F simultaneously, in the examples that the lattice plane of the second surface 210b of the semiconductor layer 210 is one of the {110} family of planes of the cubic system, the pit portions 216 are square based pyramid pit portions, which are similar to the pit portions 144a shown in FIG. 2A and FIG. 2B. Furthermore, four edges of a base of each of the pit portions 216 are non-parallel with four edges of the pixel region 270.

Referring to FIG. 3A, FIG. 3B, and FIG. 5F simultaneously, in the examples that the lattice plane of the second surface 210b of the semiconductor layer 210 is one of the {111} family of planes of the cubic system, the pit portions 216 are triangular based pyramid pit portions, which are similar to the pit portions 144b shown in FIG. 3A and FIG. 3B. In addition, one edge of a base of each of the pyramid pit portions 216 is substantially parallel to two opposite edges of the pixel region 270.

Referring to FIG. 4A, FIG. 4B, and FIG. 5F simultaneously, in the examples that the lattice plane of the second surface 210b of the semiconductor layer 210 is one of the {110} family of planes of the cubic system, the pit portions 216 are square based prism pit portion, which are similar to the pit portions 144c shown in FIG. 4A and FIG. 4B. In addition, two opposite edges of the base of each of the pit portions 216 are substantially parallel to two opposite edges of the pixel region 270, and the other two opposite edges of the base of each of the pit portions 216 are substantially parallel to the other two opposite edges of the pixel region 270.

As shown in FIG. 5G, the hard mask layer 280a is removed to expose the isolation fillers 260. Then, as shown in FIG. 5H, the isolation fillers 260 are removed from the trenches 214, and the trenches 214 are then filled with the isolation structures 290. The isolation fillers 260 may be removed by using an etching technique, and the isolation structures 290 may be formed by using a chemical vapor deposition technique. In certain examples, as shown in FIG. 5H, in forming the isolation structures 290, a dielectric layer 292 is formed on the second surface 210b of the semiconductor layer 210, in which the trenches 214 are filled with the dielectric layer 292, such that the isolation structures 290 are respectively formed in the trenches 214. The second surface 210b of the semiconductor layer 210 and the pyramid pit portions 216 are covered by the dielectric layer 292.

At operation 480, as shown in FIG. 5I, a buffer layer 300 may be optionally formed to cover the second surface 210b of the semiconductor layer 210 and the isolation structures 290 by using a deposition technique. In some examples, as shown in FIG. 5I, the buffer layer 300 is formed to cover the dielectric layer 292.

At operation 490, as shown in FIG. 5J, a metal grid layer 310 may be optionally formed on portions of the buffer layer 300 by using a deposition technique, a photolithography technique, and an etching technique. The deposition technique may be a physical vapor deposition technique or a chemical vapor deposition technique, and the etching technique may be a dry etching technique.

At operation 500, as shown in FIG. 5K, a passivation layer 320 may be optionally formed on and covering the buffer layer 300 and the metal grid layer 310, so as to substantially complete a semiconductor device 330.

In accordance with an embodiment, the present disclosure discloses a semiconductor device, which is operated for sensing incident light. The semiconductor device includes a carrier, a device layer, and a semiconductor layer. The device layer is disposed on the carrier. The semiconductor layer is disposed on the device layer. The semiconductor layer includes various light-sensing regions. The semiconductor layer has a first surface and a second surface opposite to the first surface. The first surface is adjacent to the device layer. The second surface has a lattice plane which is tilted with respect to a basal plane. The semiconductor layer has various pit portions arranged on the second surface.

In accordance with one embodiment, the semiconductor device further includes isolation structures disposed in the semiconductor layer to define various pixel regions, in which each of the pixel regions includes one of the light-sensing regions.

In accordance with one embodiment, the lattice plane of the second surface of the semiconductor layer is one of a {110} family of planes of a cubic system, and each of the pit portions is a square based pyramid pit portion or a square based prism pit portion.

In accordance with one embodiment, each of the pixel regions is a rectangular region, and four edges of a base of each of the square based pyramid pit portions are non-parallel with four edges of each of the pixel regions.

In accordance with one embodiment, each of the pixel regions is a rectangular region, two edges of a base of each of the square based prism pit portions are parallel with two edges of each of the pixel regions, and the other two edges of the base of each of the square based prism pit portions are parallel with the other two edges of each of the pixel regions.

In accordance with one embodiment, the lattice plane of the second surface of the semiconductor layer is one of a {111} family of planes of a cubic system, and each of the pit portions is a triangular based pyramid pit portion.

In accordance with one embodiment, each of the pixel regions is a rectangular region, and one of three edges of a base of each of the triangular based pyramid pit portions is substantially parallel to two opposite edges of each of the pixel regions.

In accordance with one embodiment, the semiconductor layer comprises a group IV material, a group IV material compound, or a group III-V material compound.

In accordance with one embodiment, the semiconductor device further includes a first passivation layer disposed on the carrier, an inter-metal dielectric layer disposed over the first passivation layer, a buffer layer overlying the second surface of the semiconductor layer, a metal grid layer disposed on portions of the buffer layer, and a second passivation layer covering the metal grid layer and the buffer layer.

In accordance with another embodiment, the present disclosure discloses a method for manufacturing a semiconductor device. In this method, a substrate is provided, in which the substrate has a surface. A semiconductor layer and a device layer are sequentially formed on the surface of the substrate. The semiconductor layer has a first surface and a second surface opposite to the first surface which is adjacent to the device layer. The second surface has a lattice plane which is tilted with respect to a basal plane. The semiconductor layer includes various light-sensing regions. The device layer is bonded to a carrier. The substrate is removed to expose the second surface of the semiconductor layer. An etching process is performed on the second surface of the semiconductor layer to form various pit portions on the second surface.

In accordance with one embodiment, after removing the substrate, the method further includes forming various trenches in the semiconductor layer to define a plurality of pixel regions, in which each of the pixel regions includes one of the light-sensing regions; and filling the trenches with various isolation fillers.

In accordance with one embodiment, performing the etching process includes: forming a hard mask layer that is on portions of the second surface of the semiconductor layer and covers the isolation fillers; etching the semiconductor layer; and removing the hard mask layer.

In accordance with one embodiment, after the etching process, the method further includes: removing the isolation fillers; filling the trenches with various isolation structures; and forming a buffer layer to cover the second surface of the semiconductor layer and the isolation structures.

In accordance with one embodiment, the lattice plane of the second surface of the semiconductor layer is one of a {110} family of planes of a cubic system, and each of the pit portions is a square based pyramid pit portion or a square based prism pit portion.

In accordance with one embodiment, each of the pixel regions is formed as a rectangular region, and four edges of a base of each of the square based pyramid pit portions are non-parallel with four edges of each of the pixel regions, or two edges of a base of each of the square based prism pit portions are parallel with two edges of each of the pixel regions, and the other two edges of the base of each of the square based prism pit portions are parallel with the other two edges of each of the pixel regions.

In accordance with one embodiment, the lattice plane of the second surface of the semiconductor layer is one of a {111} family of planes of a cubic system, and each of the pit portions is a triangular based pyramid pit portion.

In accordance with one embodiment, each of the pixel regions is formed as a rectangular region, and one of three edges of a base of each of the triangular based pyramid pit portions is substantially parallel to two opposite edges of each of the pixel regions.

In accordance with yet another embodiment, the present disclosure discloses a method for manufacturing a semiconductor device. In this method, a substrate having a surface is provided. A semiconductor layer is formed on the surface of the substrate. The semiconductor layer includes various light-sensing regions and has a first surface and a second surface opposite to the first surface. The second surface has a lattice plane which is tilted with respect to a basal plane. A device layer is formed on the first surface of the semiconductor layer. The device layer is bonded to a carrier. The substrate is removed to expose the second surface of the semiconductor layer. Various trenches are formed in the semiconductor layer to define various pixel regions, in which each of the pixel regions comprises one of the light-sensing regions. The trenches are filled with various isolation fillers. A hard mask material layer is formed to cover the second surface of the semiconductor layer and the isolation fillers. The hard mask material layer and the semiconductor layer are patterned to expose portions of the semiconductor layer. The portions of the semiconductor layer are etched to form various pit portions on the second surface via the hard mask material layer.

In accordance with one embodiment, the lattice plane of the second surface of the semiconductor layer is one of a {110} family of planes of a cubic system, and each of the pyramid pit portions is a square based pyramid pit portion or a square based prism pit portion. Each of the pixel regions is formed as a rectangular region. Four edges of a base of each of the pyramid pit portions are non-parallel with four edges of each of the pixel regions, or two edges of a base of each of the square based prism pit portions are parallel with two edges of each of the pixel regions, and the other two edges of the base of each of the square based prism pit portions are parallel with the other two edges of each of the pixel regions.

In accordance with one embodiment, the lattice plane of the second surface of the semiconductor layer is one of a {111} family of planes of a cubic system, and each of the pit portions is a triangular based pyramid pit portion. Each of the pixel regions is formed as a rectangular region, and one of three edges of a base of each of the triangular based pyramid pit portions is substantially parallel to two opposite edges of each of the pixel regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a semiconductor layer on a substrate, the semiconductor layer having a front-side surface and a backside surface between the front-side surface and the substrate;
    forming a plurality of light-sensing regions in the semiconductor layer;
    forming transistors on the front-side surface of the semiconductor layer;
    forming an inter-metal layer over the transistors, and a passivation layer over the inter-metal layer;
    bonding the passivation layer to a carrier;
    thinning down the substrate to expose the backside surface of the semiconductor layer;
    performing a first etching step to form a plurality of trenches extending from the backside surface of the semiconductor layer into the semiconductor layer, the plurality of trenches spacing the plurality of light-sensing regions from each other;
    after performing the first etching step, performing a second etching step to form a plurality of recesses in the backside surface of the semiconductor layer and shallower than the trenches;

performing a third etching step to reshape the recesses into pits having pointed bottoms when viewed in a cross section; and
depositing a dielectric material filling the trenches and the recesses.

2. The method of claim 1, wherein forming the semiconductor layer on the substrate is performed such that the backside surface of the semiconductor layer has a lattice plane which is tilted with respect to a basal plane.

3. The method of claim 2, wherein the lattice plane of the backside surface of the semiconductor layer is one of a {110} family of planes of a cubic system.

4. The method of claim 2, wherein the lattice plane of the backside surface of the semiconductor layer is one of a {111} family of planes of a cubic system.

5. The method of claim 1, wherein the second and third etching steps are of different types of etching.

6. The method of claim 1, wherein the third etching step is wet etching.

7. The method of claim 1, wherein the second etching step is dry etching.

8. The method of claim 1, further comprising:
forming a buffer layer over the dielectric material;
depositing a metal grid layer over the buffer layer; and
patterning the metal grid layer such that remaining portions of the metal grid layer vertically overlap the trenches, respectively.

9. The method of claim 8, further comprising:
after patterning the metal grid layer, forming a passivation layer over the buffer layer and the remaining portions of the metal grid layer.

10. The method of claim 1, wherein the dielectric material comprises silicon oxide, silicon nitride, silicon oxynitride, or silicon carbide.

11. A method comprising:
forming a semiconductor layer on a substrate, the semiconductor layer having a backside surface contacting the substrate and a front-side surface away from the substrate;
forming light-sensing regions in the semiconductor layer;
forming transistors on the front-side surface of the semiconductor layer;
after forming the transistors, removing the substrate to expose the backside surface of the semiconductor layer;
etching the backside surface of the semiconductor layer to form trenches in the semiconductor layer;
forming isolation plugs in the trenches and a hard mask layer over the isolation plugs;
etching the hard mask layer to form through holes that expose regions of the backside surface of the semiconductor layer;
etching the exposed regions of the backside surface of the semiconductor layer to form pits in the backside surface;
removing the hard mask layer and the isolation plugs; and
after removing the hard mask layer and the isolation plugs, depositing a dielectric material in the trenches and the pits.

12. The method of claim 11, wherein etching the hard mask layer is performed such that bottoms of the through holes are lower than the backside surface of the semiconductor layer.

13. The method of claim 11, wherein etching the exposed regions of the backside surface of the semiconductor layer is performed such that top widths of the pits are greater than widths of the through holes.

14. The method of claim 11, wherein forming the semiconductor layer on the substrate is performed such that a lattice plane of the backside surface of the semiconductor layer is one of a {110} family of planes of a cubic system.

15. The method of claim 11, wherein forming the semiconductor layer on the substrate is performed such that a lattice plane of the backside surface of the semiconductor layer is one of a {111} family of planes of a cubic system.

16. A method, comprising:
forming photodiodes extending from a front-side surface of a semiconductor layer into the semiconductor layer;
forming transistors on the front-side surface of the semiconductor layer;
forming an interconnect structure over the transistors, the interconnect structure comprising an inter-metal dielectric and metal lines in the inter-metal dielectric;
etching first regions of a backside surface of the semiconductor layer to form trenches in the semiconductor layer and non-overlapping the photodiodes;
filling the trenches with a plurality of isolation fillers;
forming a hard mask material layer over the backside surface of the semiconductor layer and the plurality of isolation fillers;
after forming the trenches, etching second regions of the backside surface of the semiconductor layer to form pits in the semiconductor layer and overlapping the photodiodes;
removing the hard mask material layer and the isolation fillers; and
depositing a dielectric material in the trenches and the pits.

17. The method of claim 16, wherein etching the second regions of the backside surface of the semiconductor layer to form the pits comprises:
dry etching the hard mask material layer and the semiconductor layer to form concavities in the hard mask material layer and the semiconductor layer; and
wet etching the semiconductor layer through the concavities.

18. The method of claim 16, further comprising:
after forming the interconnect structure over the transistors, forming a passivation layer over the interconnect structure; and
bonding the passivation layer to a carrier.

19. The method of claim 16, wherein the trenches have a bottom width greater than a bottom width of the pits.

20. The method of claim 16, wherein forming the pits in the semiconductor layer comprises:
performing a first etching step to form recesses in the second regions of the backside surface of the semiconductor layer; and
performing a second etching step to reshape the recesses into the pits having pointed bottoms when viewed in a cross section.

* * * * *